United States Patent
Wong et al.

(10) Patent No.: US 11,302,778 B2
(45) Date of Patent: Apr. 12, 2022

(54) SEMICONDUCTOR DEVICE AND MANUFACTURING METHOD THEREFOR

(71) Applicant: INNOSCIENCE (ZHUHAI) TECHNOLOGY CO., LTD., Zhuhai (CN)

(72) Inventors: King Yuen Wong, Zhuhai (CN); Ronghui Hao, Zhuhai (CN); Jinhan Zhang, Zhuhai (CN)

(73) Assignee: Innoscience (Zhuhai) Technology Co., Ltd., Zhuhai (CN)

( * ) Notice: Subject to any disclaimer, the term of this patent is extended or adjusted under 35 U.S.C. 154(b) by 56 days.

(21) Appl. No.: 16/842,782

(22) Filed: Apr. 8, 2020

(65) Prior Publication Data

US 2021/0202698 A1 Jul. 1, 2021

(30) Foreign Application Priority Data

Dec. 27, 2019 (CN) .......................... 201911380209.4

(51) Int. Cl.
*H01L 29/66* (2006.01)
*H01L 29/08* (2006.01)
*H01L 29/778* (2006.01)

(52) U.S. Cl.
CPC .... *H01L 29/0843* (2013.01); *H01L 29/66462* (2013.01); *H01L 29/7787* (2013.01)

(58) Field of Classification Search
CPC ........... H01L 29/0843; H01L 29/66462; H01L 29/7787
USPC ................................................... 257/192, 194
See application file for complete search history.

(56) References Cited

U.S. PATENT DOCUMENTS

| | | | |
|---|---|---|---|
| 6,329,677 B1 | 12/2001 | Oguri et al. | |
| 9,443,968 B2 | 9/2016 | Hwang et al. | |
| 10,553,712 B2* | 2/2020 | Shrivastava | .......... H01L 29/778 |
| 2007/0051977 A1 | 3/2007 | Saito et al. | |
| 2014/0209919 A1 | 7/2014 | Chiu et al. | |
| 2016/0056145 A1 | 2/2016 | Nagumo et al. | |

(Continued)

FOREIGN PATENT DOCUMENTS

| | | |
|---|---|---|
| CN | 105206663 A | 12/2015 |
| CN | 106960874 A | 7/2017 |
| JP | 2011071307 A | 4/2011 |

OTHER PUBLICATIONS

First Office Action of the corresponding China patent application No. 201911380209.4 dated Jan. 30, 2022.

(Continued)

*Primary Examiner* — Tan N Tran
(74) *Attorney, Agent, or Firm* — Idea Intellectual Limited; Margaret A. Burke; Sam T. Yip

(57) ABSTRACT

The present disclosure provides a high electron mobility transistor (HEMT). The HEMT includes a substrate, a buffer layer, a channel layer, a barrier layer, a source, a drain, and a gate. The substrate, the buffer layer, the channel layer, the barrier layer, the source, the drain, and the gate are stacked in sequence in a thickness direction of the HEMT. The channel layer includes a doped semiconductor structure. The present disclosure further provides a method for manufacturing an HEMT. The HEMT has good performance and has features such as low drain electric field intensity, a high breakdown voltage, high stability, and low costs.

7 Claims, 18 Drawing Sheets

(56) References Cited

U.S. PATENT DOCUMENTS

2017/0373179 A1 12/2017 Sriram et al.
2019/0081164 A1 3/2019 Shrivastava

OTHER PUBLICATIONS

Koushik Bharadwaj et al, Current Collapse Reduction Technique Using N-Doped Buffer Layer into the Bulk Region of a Gate Injection Transistor, 2019 32nd International Conference on VLSI Design and 2019 18th International Conference on Embedded Systems (VLSID), p. 494-495.

* cited by examiner

SEMICONDUCTOR DEVICE AND MANUFACTURING METHOD THEREFOR

CROSS REFERENCE TO RELATED APPLICATIONS

The present application claims the benefit of priority from the China Patent Application No. 201911380209.4, filed on Dec. 27, 2019, the disclosure of which is hereby incorporated by reference in its entirety.

BACKGROUND OF THE INVENTION

1. Field of the Invention

This disclosure relates to a semiconductor device, and in particular, to a high electron mobility transistor (HEMT) semiconductor device.

2. Description of the Related Art

For an HEMT, impact of a drain electric field on withstand voltage for a device may be reduced by the introduction of a multi-layer field plate structure or by an increase in the thickness of an epitaxial layer on a substrate, both of which lead to a relatively high breakdown voltage. However, due to a lattice mismatch and a thermal mismatch between the substrate and the epitaxial layer, it is difficult to increase the thickness of an epitaxial layer on a large-size substrate. In addition, a drain field plate will notably increase a parasitic capacitance for the device, such as a drain-gate capacitance (Cgd) and a drain-source capacitance (Cds). Consequently, transforming efficiency and reliability are reduced. Due to the foregoing limitation, the voltage applied to HEMTs in the market is commonly lower than 900 V, which limits applications of the HEMT in many fields.

SUMMARY OF THE INVENTION

An objective of the present disclosure is to provide an HEMT and a method for manufacturing the HEMT. The HEMT of the present disclosure has a low electric field intensity on the drain side, a high breakdown voltage, and high stability. To achieve the foregoing objective, according to an aspect of the present disclosure, an HEMT is provided. The HEMT includes: a substrate, a buffer layer, a channel layer, a barrier layer, a source, a drain, and a gate. The substrate, the channel layer, the barrier layer, the source, the drain, and the gate are stacked in sequence in a thickness direction of the HEMT. The channel layer includes a doped semiconductor structure.

Some embodiments of this disclosure provide a method for forming a semiconductor device. The method includes: forming a channel layer on a buffer layer; forming a barrier layer on the channel layer; and doping the channel layer with a dopant to form a doped semiconductor structure.

BRIEF DESCRIPTION OF THE DRAWINGS

The aspects of this disclosure will become more comprehensible from the following specific implementations with reference to the accompanying drawings. It should be noted that, various features may not be drawn to scale. Actually, the sizes of the various features may be increased or reduced arbitrarily for the purpose of clear description.

PREFERRED EMBODIMENT OF THE PRESENT DISCLOSURE

Figure 1A:
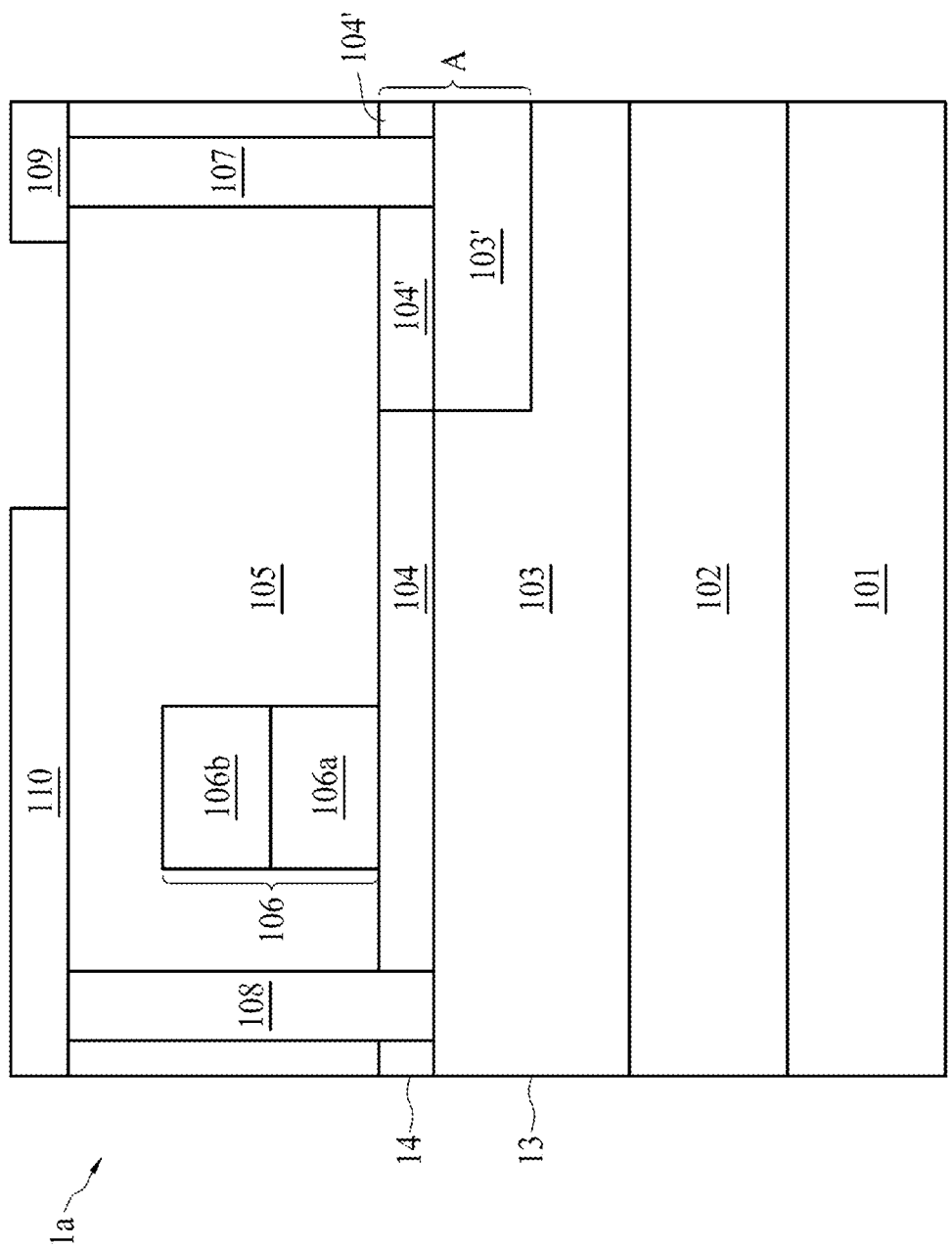
FIG. 1A is a side view of a semiconductor device according to some embodiments of this application.

The following disclosure provides many different embodiments or examples for implementing different features of the provided subject matter. The following describes specific examples of components and deployments. Certainly, these descriptions are merely examples and are not intended to be limiting. In this disclosure, in the following descriptions, the description that the first feature is formed on or above the second feature may include an embodiment in which the first feature is formed in direct contact with the second feature, and may further include an embodiment in which an additional feature may be formed between the first feature and the second feature to enable the first feature and the second feature to be not in direct contact with each other. In addition, in this disclosure, reference numerals and/or letters may be repeated in various examples. This repetition is made for the purpose of simplification and clarity, and does not specify a relationship between the various embodiments and/or configurations described.

The embodiments of this disclosure are described in detail below. However, it should be understood that, many applicable concepts provided in this disclosure may be implemented in various specific environments. The described specific embodiments are only illustrative and do not limit the scope of this disclosure.

A direct bandgap material, such as a III-V group compound, may include, for example, but is not limited to, gallium arsenide (GaAs), indium phosphide (InP), gallium nitride (GaN), indium gallium arsenide (InGaAs), and aluminum gallium arsenide (InAlAs).

FIG. 1A shows a structure 1a of a semiconductor device according to some embodiments of this application.

As shown in FIG. 1A, the structure 1a may include a substrate 101, a buffer layer 102, a semiconductor layer 13, a semiconductor layer 14, a passivation layer 105, a conductive structure 106, a conductive structure 107, a conductive structure 108, a conductive structure 109, and a conductive structure 110. As shown in FIG. 1A, the substrate 101, the buffer layer 102, the semiconductor layer 13, the semiconductor layer 14, the passivation layer 105 (or the conductive structure 106, the conductive structure 107, and the conductive structure 108), the conductive structure 109 (or the conductive structure 110) are stacked in sequence in a thickness direction of the structure 1a.

The substrate 101 may include, for example, but is not limited to, silicon (Si), doped silicon (doped Si), silicon carbide (SiC), silicon germanium (SiGe), GaAs, or another semiconductor material. The substrate 101 may include, for example, but is not limited to, sapphire, silicon on insulator (SOI), or another suitable material. In some embodiments, the substrate 101 may further include a doped region (not indicated in FIG. 1A) such as a p well and an n well.

The buffer layer 102 may be disposed on the substrate 101. In some embodiments, the buffer layer 102 may include nitrides. In some embodiments, the buffer layer 102 may include, for example, but is not limited to, aluminum nitride (AlN). In some embodiments, the buffer layer 102 may include, for example, but is not limited to, GaN. In some embodiments, the buffer layer 102 may include, for example, but is not limited to, aluminum gallium nitride (AlGaN). In some embodiments, the buffer layer 102 may include, for example, but is not limited to, GaAs. In some embodiments, the buffer layer 102 may include, for example, but is not limited to, aluminum arsenide (AlAs). In some embodiments, the buffer layer 102 may include, for example, but is not limited to, zinc oxide (ZnO).

The buffer layer 102 may be disposed between the substrate 101 and the semiconductor layer 13. Disposing the buffer layer 102 between the substrate 101 and the semiconductor layer 13 may reduce lattice mismatches and thermal mismatches between the substrate 101 and the semiconductor layer 13. Due to a huge lattice mismatch and a huge thermal mismatch between the GaN and a Si substrate, it is extremely hard to epitaxially grow a GaN single crystal on the Si substrate. For example, after GaN is epitaxially grown at a high temperature, the thermal mismatch between GaN and the Si substrate may introduce a stress during a temperature drop process, leading to warping and even cracking of the GaN epitaxial layer. Therefore, a buffer layer can effectively relieve the lattice mismatch and the thermal mismatch between the GaN epitaxial layer and the Si substrate, reducing strain produced by the GaN epitaxial layer due to the stress, and reducing occurrence of disposition and defects.

The semiconductor layer 13 may be disposed on the buffer layer 102. The semiconductor layer 13 may further include a semiconductor layer 103 and a doped semiconductor structure 103'.

The semiconductor layer 103 may be disposed on the buffer layer 102. The semiconductor layer 103 may include a III-V group material. The semiconductor layer 103 may include, for example, but is not limited to, III group nitrides. The semiconductor layer 103 may include, for example, but is not limited to, GaN. The semiconductor layer 103 may include, for example, but is not limited to, AlN. The semiconductor layer 103 may include, for example, but is not limited to, InN. The semiconductor layer 103 may include, for example, but is not limited to, a compound $In_xAl_yGa_{1-x-y}N$, where $x+y \leq 1$. The semiconductor layer 103 may include, for example, but is not limited to, a compound $Al_yGa_{(1-y)}N$, where $y \leq 1$.

The doped semiconductor structure 103' may be disposed on the buffer layer 102. The doped semiconductor structure 103' may include a doped III-V group material. The doped semiconductor structure 103' may include an n-type III-V group material. The doped semiconductor structure 103' may include, for example, but is not limited to, n-type III group nitrides. The doped semiconductor structure 103' may include, for example, but is not limited to, n-type GaN. The doped semiconductor structure 103' may include, for example, but is not limited to, n-type AlN. The doped semiconductor structure 103' may include, for example, but is not limited to, n-type InN. The doped semiconductor structure 103' may include, for example, but is not limited to, an n-type compound $In_xAl_yGa_{1-x-y}N$, where $x+y \leq 1$. The doped semiconductor structure 103' may include, for example, but is not limited to, an n-type compound $Al_yGa_{(1-y)}N$, where $y \leq 1$. The doped semiconductor structure 103' may include, for example, but is not limited to, n-type AlInGaN. The doped semiconductor structure 103' may include, for example, but is not limited to, n-type InAlN. The doped semiconductor structure 103' may include, for example, but is not limited to, n-type InN. A dopant material of the doped semiconductor structure 103' may include, for example, but is not limited to, at least one of Si and germanium (Ge). The thickness of the doped semiconductor structure 103' may range from approximately 2 nm to approximately 1000 nm. The thickness of the doped semiconductor structure 103' may preferably range from approximately 50 nm to approximately 800 nm. A doping concentration of the doped semiconductor structure 103' may range from approximately $10^{14}$ cm$^{-3}$ to approximately $10^{21}$ cm$^{-3}$. The doping concentration of the doped semiconductor structure 103' may preferably range from approximately $10^{14}$ cm$^{-3}$ to approximately $10^{20}$ cm$^{-3}$. The doping concentration of the doped semiconductor structure 103' may preferably range from approximately $10^{16}$ cm$^{-3}$ to approximately $10^{20}$ cm$^{-3}$. The doping concentration of the doped semiconductor structure 103' may optimally range from approximately $10^{18}$ cm$^{-3}$ to approximately $10^{20}$ cm$^{-3}$. In some embodiments, the doping concentration of the doped semiconductor structure 103' may be distributed in a Gaussian distribution. In some embodiments, the width of the doped semiconductor structure 103' may be defined by the doping concentration of the dopant material. In some embodiments, for example, the width of the doped semiconductor structure 103' may be defined by observable edges of dopant materials on two ends in the side view of FIG. 1A. In some embodiments, the width of the doped semiconductor structure 103' may be between approximately 10 nm and approximately 10 μm. In some embodiments, the width of the doped semiconductor structure 103' may be between approximately 1 μm and approximately 5 μm. In some embodiments, the doped semiconductor structure 103' may not extend to an interface between the buffer layer 102 and the semiconductor layer 13. In some embodiments, the doped semiconductor structure 103' may extend to an interface between the buffer layer 102 and the semiconductor layer 13.

In some embodiments, the doped semiconductor structure 103' may surround the conductive structure 107. In some embodiments, the doped semiconductor structure 103' may surround the conductive structure 107. In some embodiments, the doped semiconductor structure 103' may be disposed below the conductive structure 107.

The semiconductor layer 14 may be disposed on the semiconductor layer 13. The semiconductor layer 14 may further include a semiconductor layer 104 and a doped semiconductor structure 104'.

The semiconductor layer 104 may be disposed on the semiconductor layer 103. The semiconductor layer 104 may include a III-V group material. The semiconductor layer 104 may include, for example, but is not limited to, III group nitrides. The semiconductor layer 104 may include, for example, but is not limited to, a compound $Al_yGa_{(1-y)}N$, where $y \leq 1$. The semiconductor layer 104 may include, for example, but is not limited to, GaN. The semiconductor layer 104 may include, for example, but is not limited to, AlN. The semiconductor layer 104 may include, for example, but is not limited to, InN. The semiconductor layer 104 may include, for example, but is not limited to, a compound $In_xAl_yGa_{1-x-y}N$, where $x+y \leq 1$.

The doped semiconductor structure 104' may be disposed on the doped semiconductor structure 103'. The doped semiconductor structure 104' may include a doped III-V group material. The doped semiconductor structure 104' may include an n-type III-V group material. The doped semiconductor structure 104' may include, for example, but is not limited to, n-type III group nitrides. The doped semiconductor structure 104' may include, for example, but is not limited to, an n-type compound $Al_yGa_{(1-y)}N$, where $y \leq 1$. The doped semiconductor structure 104' may include, for example, but is not limited to, n-type GaN. The doped semiconductor structure 104' may include, for example, but is not limited to, n-type AlN. The doped semiconductor structure 104' may include, for example, but is not limited to, n-type InN. The doped semiconductor structure 104' may include, for example, but is not limited to, an n-type compound $In_xAl_yGa_{1-x-y}N$, where $x+y \leq 1$. The doped semiconductor structure 104' may include, for example, but is not limited to, n-type AlInGaN. The doped semiconductor structure 104' may include, for example, but is not limited to, n-type AlInN. A dopant material of the doped semiconductor structure 104' may include, for example, but is not limited to, at least one of Si and germanium (Ge). The thickness of the doped semiconductor structure 104' may be the same as that of the semiconductor layer 104. The thickness may be defined as a distance between an interface between the semiconductor layer 14 and the semiconductor layer 13 and an interface between the semiconductor layer 14 and the passivation layer 105. A doping concentration of the doped semiconductor structure 104' may range from approximately $10^{14}$ cm$^{-3}$ to approximately $10^{21}$ cm$^{-3}$. The doping concentration of the doped semiconductor structure 104' may preferably range from approximately $10^{14}$ cm$^{-3}$ to approximately $10^{20}$ cm$^{-3}$. The doping concentration of the doped semiconductor structure 104' may preferably range from approximately $10^{16}$ cm$^{-3}$ to approximately $10^{20}$ cm$^{-3}$. The doping concentration of the doped semiconductor structure 104' may optimally range from approximately $10^{18}$ cm$^{-3}$ to approximately $10^{20}$ cm$^{-3}$. In some embodiments, the doping concentration of the doped semiconductor structure 103' may be distributed in a Gaussian distribution. In some embodiments, the doping concentration of the doped semiconductor structure 104' may be the same as the doping concentration of the doped semiconductor structure 103'. In some embodiments, the doping concentration of the doped semiconductor structure 104' may be different from the doping concentration of the doped semiconductor structure 103'. In some embodiments, the width of the doped semiconductor structure 104' may be defined by the doping concentration of the dopant material. In some embodiments, for example, the width of the doped semiconductor structure 104' may be defined by observable edges of dopant materials on two ends in the side view of FIG. 1A. In some embodiments, the width of the doped semiconductor structure 104' may be between approximately 10 nm and approximately 10 µm. In some embodiments, the width of the doped semiconductor structure 104' may be between approximately 1 µm and approximately 5 µm. In some embodiments, the width of the doped semiconductor structure 104' may be the same as that of the doped semiconductor structure 103'. In some embodiments, the width of the doped semiconductor structure 104' may be different from that of the doped semiconductor structure 103'. In some embodiments, the doped semiconductor structure 104' may be in direct contact with the doped semiconductor structure 103'.

In some embodiments, the doped semiconductor structure 104' may surround the conductive structure 107. In some embodiments, the doped semiconductor structure 104' may surround the conductive structure 107. In some embodiments, the doped semiconductor structure 104' may be disposed below the conductive structure 107.

In some embodiments, the doped semiconductor structure 104' and the doped semiconductor structure 103' may form a structure A. In some embodiments, the structure A may be disposed below the conductive structure 107. In some embodiments, the structure A may be disposed below the conductive structure 107 and surround the conductive structure 107. In some embodiments, the structure A may be disposed below the conductive structure 107 and surround the conductive structure 107. In some embodiments, the structure A may be disposed below the conductive structure 107 and extend toward a portion below the conductive structure 106.

In some embodiments, the structure A may include a doped semiconductor material. In some embodiments, the structure A may include a doped semiconductor material with a high doping concentration. In some embodiments, the structure A may include a doped semiconductor material with a high carrier concentration. In some embodiments, the structure A may include a doped semiconductor material with a high electron concentration.

In some embodiments, the structure A may be considered as a deceleration structure of a depletion region (not shown in FIG. 1A). In some embodiments, the structure A may be considered as a deceleration structure of a depletion region below the conductive structure 106.

In some embodiments, the structure A may reduce an extension speed of a depletion region. In some embodiments, the structure A may reduce a peak electric field of the conductive structure 107. In some embodiments, the structure A may increase a breakdown voltage. In some embodiments, the structure A may increase working stability of the semiconductor device.

Referring to FIG. 1A again, the material of the semiconductor layer 14 may be different from that of the semiconductor layer 13. A heterojunction interface may be formed between the semiconductor layer 14 and the semiconductor layer 13. A forbidden band width of the semiconductor layer 14 may be greater than that of the semiconductor layer 13. For example, the semiconductor layer 13 may include GaN. GaN may have a forbidden band width of approximately 3.4 eV. The semiconductor layer 14 may include AlGaN. AlGaN may have a forbidden band width of approximately 3.4 eV to 6.2 eV, for example, a forbidden band width of 4 eV. Because the forbidden band width of the semiconductor layer 14 is greater than the forbidden band width of the semiconductor layer 13, free charges transfer from the semiconductor layer 14 to the semiconductor layer 13, resulting in polarization of the heterojunction interface. Consequently, electrons spill out from the semiconductor layer 14 of a wide bandgap, and only positive charges (donor ions) remain. The space charges produce an electrostatic potential, leading to bending of an energy band, and a two-dimensional potential well formed at the heterojunction interface. The two-dimensional potential well may limit the electrons induced due to the polarization in the well. The electrons may perform two-dimensional movement in a plane parallel to an interface between the semiconductor layer 14 and the semiconductor layer 13 in the potential well. Therefore, charges accumulate at the interface between the semiconductor layer 14 and the semiconductor layer 13, and form two-dimensional electron gas (2DEG). The 2DEG may have extremely high electron mobility. In some embodiments, compared with the semiconductor layer 13, the semiconductor layer 14 having a greater forbidden band width may serve as the barrier layer of the structure 1a. In some embodiments, compared with the semiconductor layer 14, the semiconductor layer 13 having a smaller forbidden band width may provide a channel for a carrier, and serve as the channel layer of the structure 1a.

The passivation layer 105 may be disposed on the semiconductor layer 14. The passivation layer 105 may be disposed on the semiconductor layer 104. The passivation layer 105 may be disposed on the doped semiconductor structure 104'. The passivation layer 105 may be disposed between the semiconductor layer 14 and the conductive structure 110. The passivation layer 105 may be disposed between the conductive structure 106 and the conductive structure 107. The passivation layer 105 may be disposed between the conductive structure 106 and the conductive structure 108. The passivation layer 105 may include a dielectric material. The passivation layer 105 may include, for example, but is not limited to, silicon nitride ($SiN_x$). The passivation layer 105 may include, for example, but is not limited to, silicon dioxide ($SiO_2$). The passivation layer 105 may include, for example, but is not limited to, aluminum oxide ($Al_2O_3$).

The passivation layer 105 may effectively inhibit current collapse of a device. The passivation layer 105 may prevent water vapor and oxygen in the environment from eroding the device. The passivation layer 105 may improve stability and reliability of the device.

The conductive structure 106 may be disposed on the semiconductor layer 14. The conductive structure 106 may be disposed on the semiconductor layer 104. The conductive structure 106 may be surrounded by the passivation layer 105. The conductive structure 106 may be surrounded by the passivation layer 105. The conductive structure 106 may be covered by the passivation layer 105.

The conductive structure 106 may further include a doped semiconductor layer 106a and a contact 106b.

The doped semiconductor layer 106a may be disposed on the semiconductor layer 14. The doped semiconductor layer 106a may be disposed on the semiconductor layer 104. The doped semiconductor layer 106a may include a doped III-V group material. The doped semiconductor layer 106a may include, for example, but is not limited to, p-type III group nitrides. The doped semiconductor layer 106a may include, for example, but is not limited to, p-type GaN. The doped semiconductor layer 106a may include, for example, but is not limited to, p-type AlN. The doped semiconductor layer 106a may include, for example, but is not limited to, p-type InN. The doped semiconductor layer 106a may include, for example, but is not limited to, p-type AlGaN. The doped semiconductor layer 106a may include, for example, but is not limited to, p-type InGaN. The doped semiconductor layer 106a may include, for example, but is not limited to, p-type InAlN. When the doped semiconductor layer 106a includes a p-type III-V group material, a dopant material of the doped semiconductor layer 106a may include, for example, but is not limited to, at least one of magnesium, zinc, and calcium.

The doped semiconductor layer 106a may be disposed on the semiconductor layer 14. The contact 106b may be disposed on the semiconductor layer 104. The contact 106b may be disposed on the doped semiconductor layer 106a, to locate the doped semiconductor layer 106a between the semiconductor layer 104 and the contact 106b. The contact 106b may include metal. The contact 106b may include, for example, but is not limited to, aurum (Au), platinum (Pt), titanium (Ti), palladium (Pd), nickel (Ni), and wolfram (W).

The contact 106b may include a metallic compound. The contact 106b may include, for example, but is not limited to, titanium nitride (TiN).

The conductive structure 107 may be disposed on the semiconductor layer 13. The conductive structure 107 may be disposed on the semiconductor layer 103. The conductive structure 107 may be disposed on the doped semiconductor structure 103'. In some embodiments, the conductive structure 107 may pass through the doped semiconductor structure 104' to come into contact with the doped semiconductor structure 103'. In some embodiments, the conductive structure 107 may extend into the doped semiconductor structure 103'. The conductive structure 107 may be surrounded by the passivation layer 105. The conductive structure 107 may include metal. The conductive structure 107 may include, for example, but is not limited to, Au, Pt, Pd, Ni, and W. The conductive structure 107 may include a metallic compound. The conductive structure 107 may include, for example, but is not limited to, TiN, tantalum nitride (TaN), and wolfram carbide (WC).

The conductive structure 108 may be disposed on the semiconductor layer 13. The conductive structure 108 may be disposed on the semiconductor layer 103. In some embodiments, the conductive structure 108 may pass through the semiconductor layer 14 to come into contact with the semiconductor layer 13. In some embodiments, the conductive structure 108 may pass through the semiconductor layer 104 to come into contact with the semiconductor layer 103. In some embodiments, the conductive structure 108 may extend into the semiconductor layer 13. In some embodiments, the conductive structure 108 may extend into the semiconductor layer 103. The conductive structure 108 may be surrounded by the passivation layer 105. The conductive structure 108 may include metal. The conductive structure 108 may include, for example, but is not limited to, Au, Pt, Pd, Ni, and W. The conductive structure 108 may include a metallic compound. The conductive structure 108 may include, for example, but is not limited to, TiN, TaN, and WC.

Referring to FIG. 1A again, the conductive structure 106 may serve as a gate conductor of the semiconductor device. In some embodiments, the conductive structure 106 may serve as a Schottky gate of the semiconductor device. The conductive structure 107 may serve as a drain conductor of the semiconductor device. The conductive structure 108 may serve as a source conductor of the semiconductor device. In FIG. 1A, the conductive structure 107 that may serve as the drain conductor and the conductive structure 108 that may serve as the source conductor are respectively disposed on two sides of the conductive structure 106 that may serve as the gate conductor. However, the conductive structure 106, the conductive structure 107, and the conductive structure 108 may have different configurations in another embodiment of the present disclosure due to a design requirement. The conductive structure 106 may be configured to control 2DEG in the semiconductor layer 13. The conductive structure 106 may apply a voltage to control the 2DEG in the semiconductor layer 13. The conductive structure 106 may apply a voltage to control 2DEG below the semiconductor layer 14. The conductive structure 106 may apply a voltage to control switch-on between the conductive structure 108 and the conductive structure 107. The conductive structure 106 may apply a voltage to control switch-off between the conductive structure 108 and the conductive structure 107.

The conductive structure 109 may be disposed on the passivation layer 105. The conductive structure 109 may be disposed on the conductive structure 107. In some embodiments, the conductive structure 109 may be electrically coupled to the conductive structure 107. In some embodiments, the conductive structure 109 may be a field plate structure. The field plate structure may reduce peak electric fields of an edge of the conductive structure 106 and an edge of the conductive structure 107, and increase a breakdown voltage of the semiconductor device. In some embodiments, the conductive structure 109 may extend on a surface of the passivation layer 105. In some embodiments, the conductive structure 109 may extend in a direction substantially parallel to a surface of the semiconductor layer 14.

The conductive structure 110 may be disposed on the passivation layer 105. The conductive structure 110 may be disposed on the conductive structure 108. In some embodiments, the conductive structure 110 may be electrically coupled to the conductive structure 108. In some embodiments, the conductive structure 110 may be a field plate structure. The field plate structure may reduce peak electric fields of an edge of the conductive structure 106 and an edge of the conductive structure 107, and increase a breakdown voltage of the semiconductor device. In some embodiments, the conductive structure 110 may extend on a surface of the passivation layer 105. In some embodiments, the conductive structure 110 may extend in a direction substantially parallel to a surface of the semiconductor layer 14.

Figure 1B:
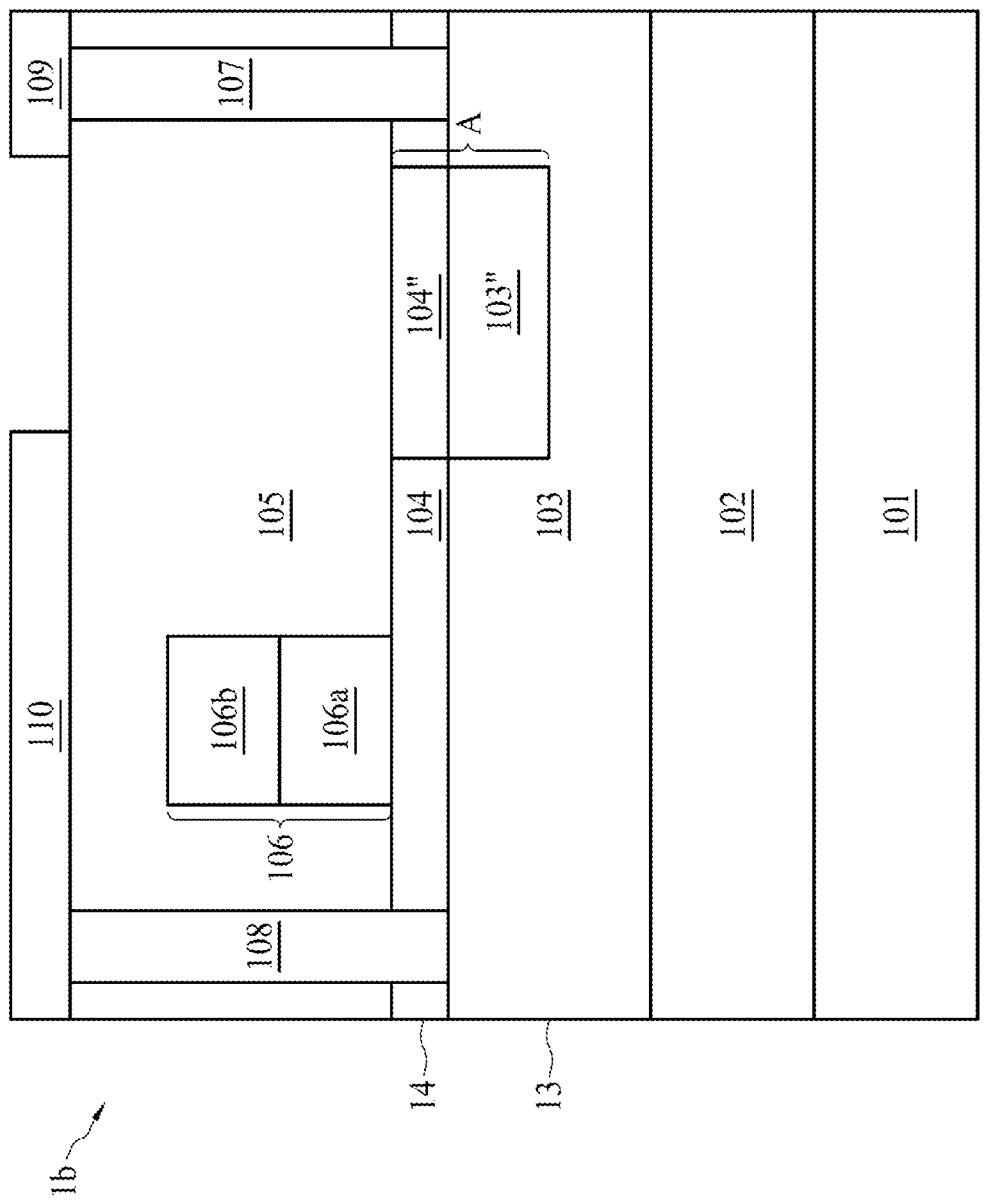
FIG. 1B is a side view of a semiconductor device according to some embodiments of this application.

FIG. 1B shows a structure 1b of a semiconductor device according to some embodiments of the present disclosure.

As shown in FIG. 1B, the structure 1b may include a substrate 101, a buffer layer 102, a semiconductor layer 13, a semiconductor layer 14, a passivation layer 105, a conductive structure 106, a conductive structure 107, a conductive structure 108, a conductive structure 109, and a conductive structure 110. The semiconductor layer 13 may further include a semiconductor layer 103 and a doped semiconductor structure 103". The semiconductor layer 14 may further include a semiconductor layer 104 and a doped semiconductor structure 104".

The structure 1b of the semiconductor device shown in FIG. 1B is similar to the structure 1a of the semiconductor device shown in FIG. 1A, and differs from the structure 1a in that: a position of the doped semiconductor structure 103" shown in FIG. 1B is different from a position of the doped semiconductor structure 103' shown in FIG. 1A, and a position of the doped semiconductor structure 104" shown in FIG. 1B is different from a position of the doped semiconductor structure 104' shown in FIG. 1A.

In some embodiments, the doped semiconductor structure 103" is disposed between a portion below the conductive structure 106 and a portion below the conductive structure 107. In some embodiments, the doped semiconductor structure 103" is disposed below the passivation layer 105 that is between the conductive structure 106 and the conductive structure 107. In some embodiments, the doped semiconductor structure 103" is disposed below the doped semiconductor structure 104". In some embodiments, the doped semiconductor structure 103" is not in contact with the conductive structure 107.

In some embodiments, the doped semiconductor structure 104" is disposed between a portion below the conductive structure 106 and a portion below the conductive structure 107. In some embodiments, the doped semiconductor structure 104" is disposed below the passivation layer 105 that is between the conductive structure 106 and the conductive structure 107. In some embodiments, the doped semiconductor structure 104" is disposed on the doped semiconductor structure 103". In some embodiments, the doped semiconductor structure 104" is not in contact with the conductive structure 107.

Figure 2:
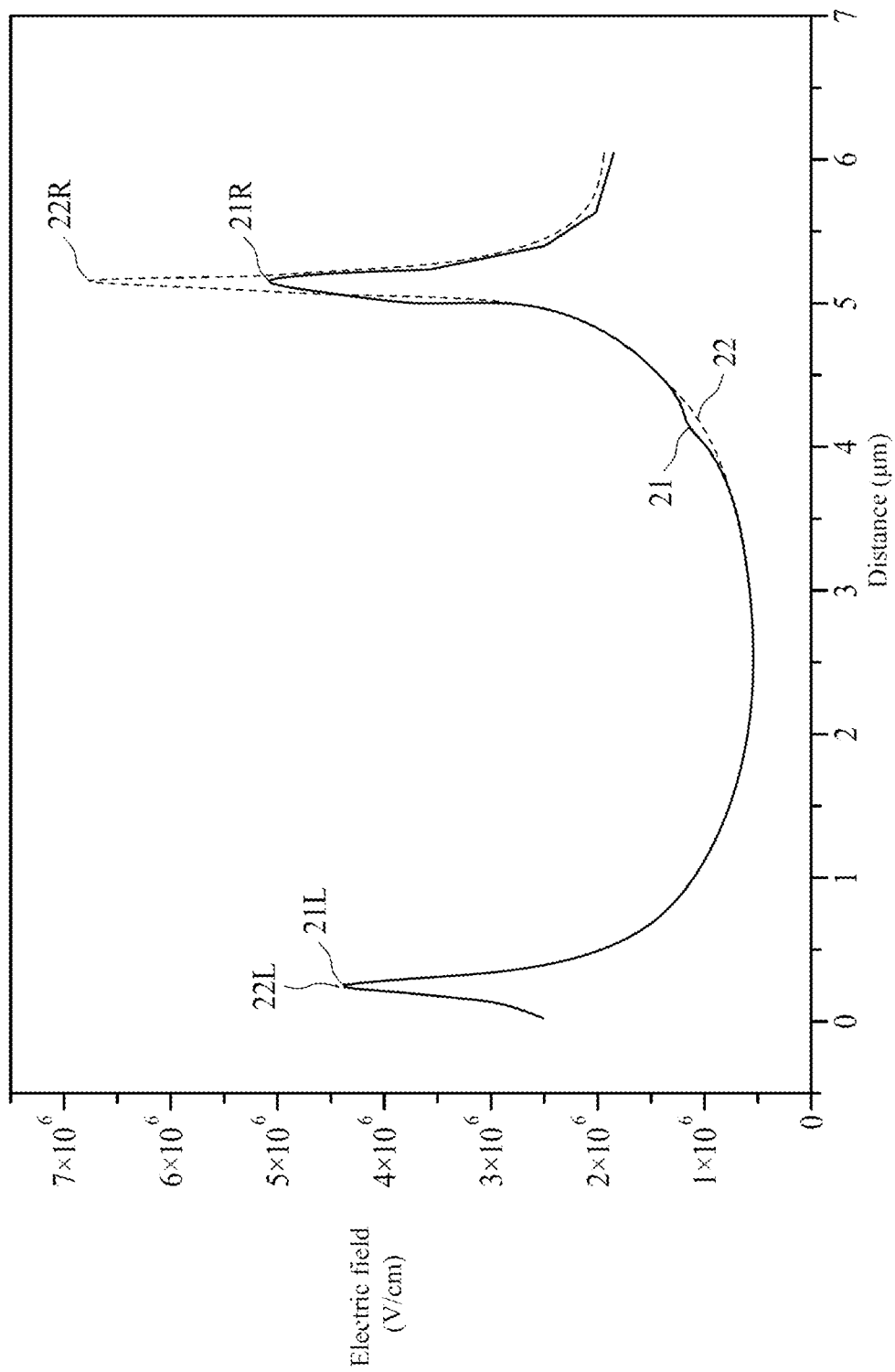
FIG. 2 is a distribution diagram of an electric field of a semiconductor device according to some embodiments of this application.

FIG. 2 is a distribution diagram of an electric field of a semiconductor device according to some embodiments of the present disclosure.

FIG. 2 shows a curve 21 and a curve 22.

The curve 21 may display a relationship between electric field and distance for the semiconductor device shown in FIG. 1A. The curve 21 may display a relationship between the electric field of the semiconductor device shown in FIG. 1A and a distance between a gate conductor and a drain conductor. The curve 21 may display a relationship between the electric field of the semiconductor device with the structure A shown in FIG. 1A and a distance between a gate conductor and a drain conductor. The curve 21 may display distribution of a drain electric field of a semiconductor device.

The curve 22 may display a relationship between electric field and distance for the semiconductor device shown in FIG. 1A. The curve 22 may display a relationship between the electric field of the semiconductor device shown in FIG. 1A and a distance between a gate conductor and a drain conductor. The curve 22 may display a relationship between the electric field of the semiconductor device without the structure A shown in FIG. 1A and a distance between a gate conductor and a drain conductor. The curve 22 may display distribution of a drain electric field of a semiconductor device.

A point 21L of the curve 21 may represent electric field intensity of the gate conductor of the semiconductor device. The point 21L may represent, for example, but not limited to, a position of an edge of the gate conductor disposed in the semiconductor device. The point 21L may represent, for example, but not limited to, a position of an edge of the gate conductor, close to the drain conductor, disposed in the semiconductor device.

A point 22L of the curve 22 may represent electric field intensity of the gate conductor of the semiconductor device. The point 22L may represent, for example, but not limited to, a position of an edge of the gate conductor disposed in the semiconductor device. The point 22L may represent, for example, but not limited to, a position of an edge of the gate conductor, close to the drain conductor, disposed in the semiconductor device.

A point 21R of the curve 21 may represent electric field intensity of the drain conductor of the semiconductor device. The point 21R may represent, for example, but not limited to, a position of an edge of the drain conductor disposed in the semiconductor device. The point 21R may represent, for example, but not limited to, a position of an edge of the drain conductor, close to the gate conductor, disposed in the semiconductor device.

A point 22R of the curve 22 may represent electric field intensity of the drain conductor of the semiconductor device. The point 22R may represent, for example, but not limited to, a position of an edge of the drain conductor disposed in the semiconductor device. The point 22R may represent, for example, but not limited to, a position of an edge of the drain conductor, close to the gate conductor, disposed in the semiconductor device.

It may be learned from FIG. 2 that, the electric field intensity of the point 21R may be lower than the electric field intensity of the point 22R. A peak electric field of the point 21R may be lower than a peak electric field of the point 22R. A drain peak electric field of the point 21R may be lower than a drain peak electric field of the point 22R. In some embodiments, reduction of the drain peak electric field may improve a breakdown voltage of the semiconductor device.

In some embodiments, the semiconductor device represented by the curve 21 may have a breakdown voltage higher than 900 V. In some embodiments, the semiconductor device represented by the curve 21 may have a breakdown voltage higher than 1200 V. In some embodiments, the semiconductor device represented by the curve 21 may have a breakdown voltage higher than 1500 V.

In some embodiments, the semiconductor device represented by the curve 22 may have a breakdown voltage higher than 200 V. In some embodiments, the semiconductor device represented by the curve 22 may have a breakdown voltage higher than 500 V. In some embodiments, the semiconductor device represented by the curve 22 may have a breakdown voltage ranging from approximately 500 to 600 V.

In some embodiments, the semiconductor device represented by the curve 21 may improve a drain electric field. In some embodiments, the semiconductor device represented by the curve 21 may not need an epitaxial layer with especially thick epitaxy. In some embodiments, the semiconductor device represented by the curve 21 may reduce process difficulty.

FIG. 3A, FIG. 3B, FIG. 3C, FIG. 3D, FIG. 3E, FIG. 3F, and FIG. 3G show several operations for manufacturing a semiconductor device according to some embodiments of this application.

Figure 3A:
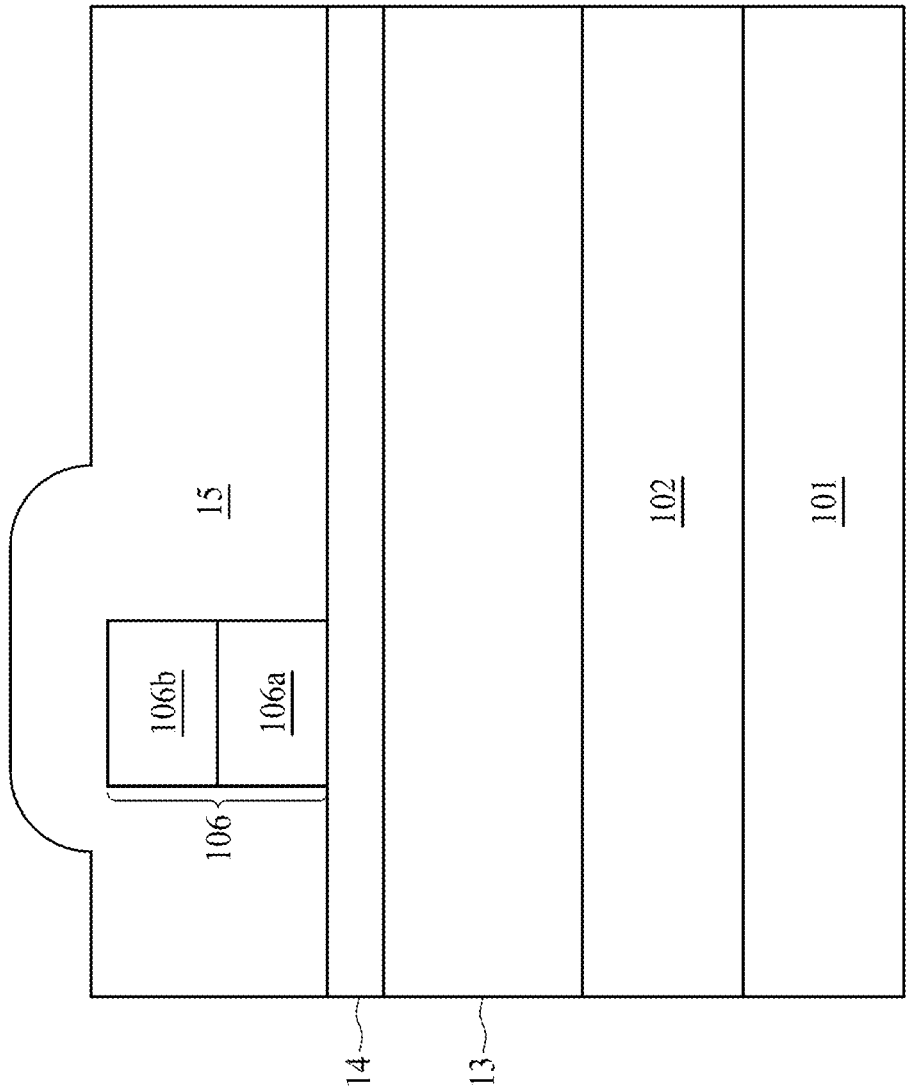
FIG. 3A, FIG. 3B, FIG. 3C, FIG. 3D, FIG. 3E, FIG. 3F, and FIG. 3G show several operations for manufacturing a semiconductor device according to some embodiments of this application.

Referring to FIG. 3A, a substrate 101 is provided. In some embodiments, a buffer layer 102 may be disposed on the substrate 101. In some embodiments, the buffer layer 102 may be formed through chemical vapor deposition (CVD) and/or another suitable deposition step. In some embodiments, the buffer layer 102 may be formed on the substrate 101 through CVD and/or another suitable deposition step.

In some embodiments, a semiconductor layer 13 may be disposed on the buffer layer 102. In some embodiments, the semiconductor layer 13 may be formed through CVD and/or another suitable deposition step. In some embodiments, the semiconductor layer 13 may be formed on the buffer layer 102 through CVD and/or another suitable deposition step.

In some embodiments, a semiconductor layer 14 may be disposed on the semiconductor layer 13. In some embodiments, the semiconductor layer 14 may be formed through CVD and/or another suitable deposition step. In some embodiments, the semiconductor layer 14 may be formed on the semiconductor layer 13 through CVD and/or another suitable deposition step. It should be noted that, the semiconductor layer 14 may be formed subsequent to the formation of the semiconductor layer 13. It should be noted that, a heterojunction interface may be formed on the semiconductor layer 13 on which the semiconductor layer 14 is disposed. It should be noted that, a forbidden band width of the formed semiconductor layer 14 may be greater than a forbidden band width of the formed semiconductor layer 13.

In some embodiments, a conductive structure 106 may be disposed on the semiconductor layer 14. The conductive structure 106 may include a doped semiconductor layer 106a and a contact 106b.

In some embodiments, the doped semiconductor layer 106a may be formed through ion implantation. In some embodiments, the doped semiconductor layer 106a may be formed by implanting, for example, but not limited to, a p-type dopant. The contact 106b may be formed on the doped semiconductor layer 106a. In some embodiments, the contact 106b may be formed through CVD, physical vapor deposition (PVD), atomic layer deposition (ALD), electroplating, and/or another suitable step. The doped semiconductor layer 106a may include a doped metallic compound. The doped semiconductor layer 106a may include, for example, but is not limited to, p-type GaN.

In some embodiments, the contact 106b may be formed on the doped semiconductor layer 106a through PVD and/or another suitable deposition step. The contact 106b may be disposed on the semiconductor layer 104. The contact 106b may be disposed on the doped semiconductor layer 106a, to locate the doped semiconductor layer 106a between the semiconductor layer 14 and the contact 106b. The contact 106b may include metal. The contact 106b may include, for example, but is not limited to, Au, Pt, Ti, Pd, Ni, and W. The contact 106b may include a metallic compound. The contact 106b may include, for example, but is not limited to, TiN.

A passivation layer 15 may be formed though a deposition step. In some embodiments, the passivation layer 15 may be deposited on the semiconductor layer 14. In some embodiments, the passivation layer 15 may be deposited on the semiconductor layer 14 through CVD and/or another suitable deposition step. In some embodiments, the passivation layer 15 may cover the semiconductor layer 14. In some embodiments, the passivation layer 15 may cover the conductive structure 106. In some embodiments, the passivation layer 15 may surround the conductive structure 106. In some embodiments, the passivation layer 15 may surround the conductive structure 106.

Figure 3B:
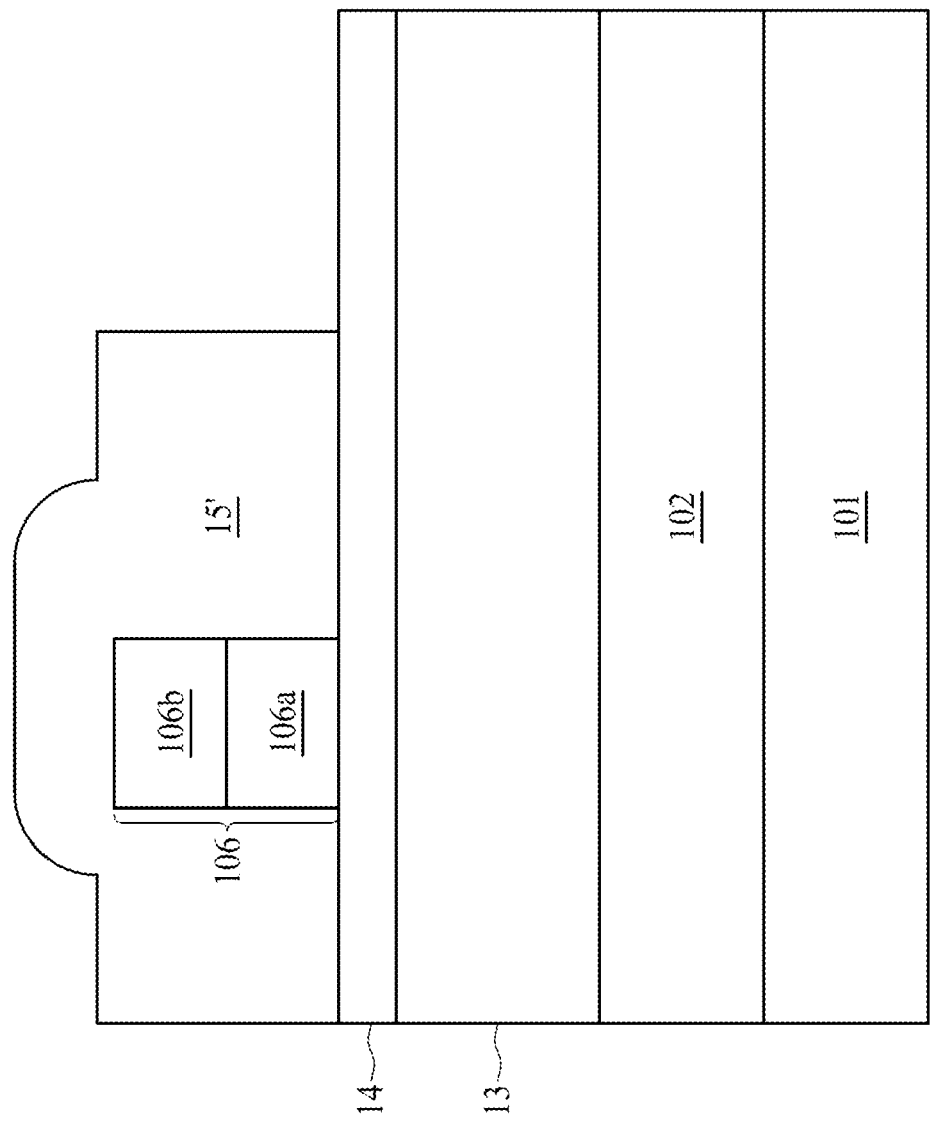

Referring to FIG. 3B, a portion of the passivation layer 15 may be removed to form a passivation layer 15'. In some embodiments, the portion of the passivation layer 15 may be removed, for example, using a photolithography process, to form the passivation layer 15'. In some embodiments, the portion of the passivation layer 15 may be removed through etching to form the passivation layer 15'.

In some embodiments, the passivation layer 15' may expose a portion of the semiconductor layer 14. In some embodiments, the exposed portion of the semiconductor layer 14 is not covered by the passivation layer 15'.

Figure 3C:
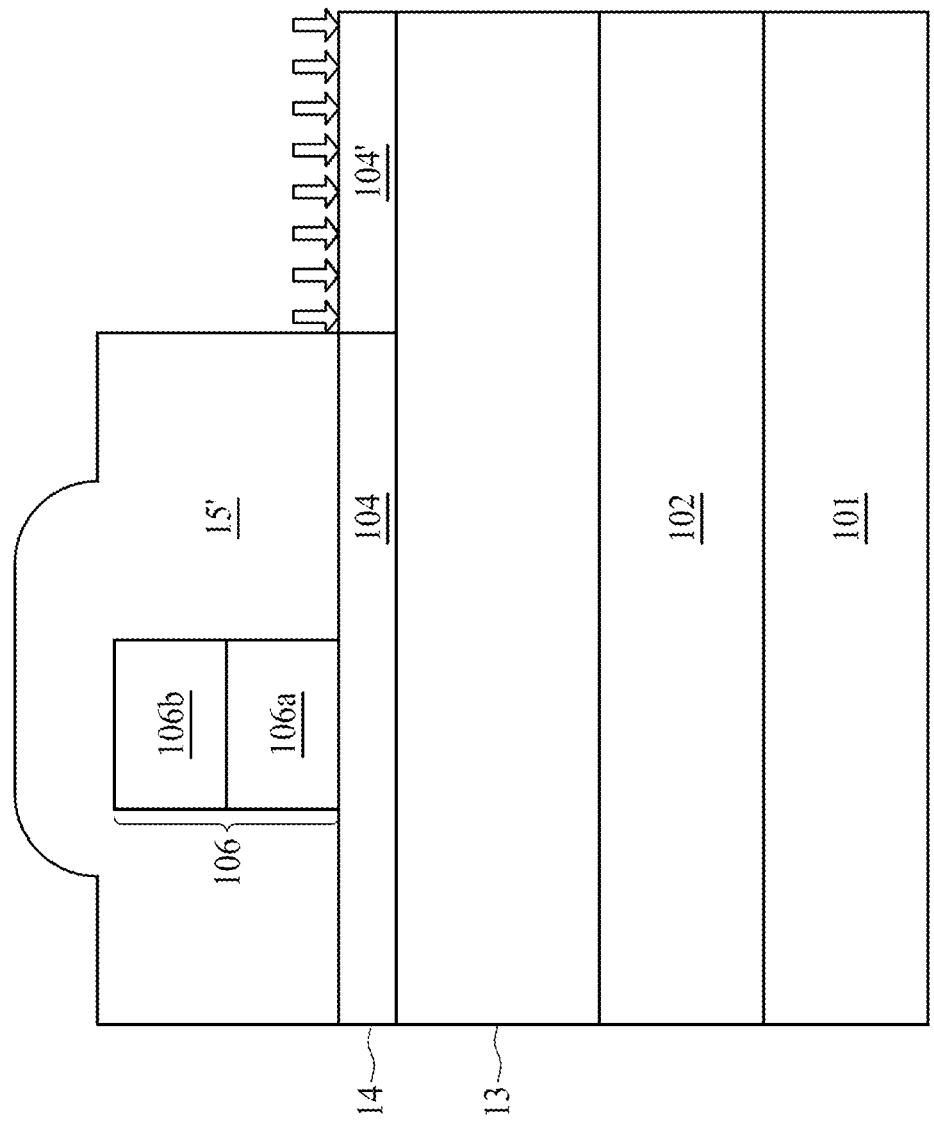

Referring to FIG. 3C, as indicated by the arrows, the exposed portion of the semiconductor layer 14 may be doped to form a doped semiconductor structure 104'. In some embodiments, a semiconductor layer 104 may be formed in the semiconductor layer 14. In some embodiments, an undoped semiconductor layer 104 may be formed in the semiconductor layer 14. In some embodiments, an undoped semiconductor layer 104 and the doped semiconductor structure 104' may be formed in the semiconductor layer 14. In some embodiments, the doped semiconductor structure 104' may be formed through ion implantation. In some embodiments, the doped semiconductor structure 104' may be formed by implanting, for example, but not limited to, an n-type dopant into the semiconductor layer 14. In some embodiments, the doped semiconductor structure 104' may be formed by implanting, for example, but not limited to, another dopant into the semiconductor layer 14. In some embodiments, the doped semiconductor structure 104' may be formed through thermal diffusion. In some embodiments, the doped semiconductor structure 104' may be formed by introducing an n-type dopant into the semiconductor layer 14 through thermal diffusion. In some embodiments, the doped semiconductor structure 104' may be formed by introducing another dopant into the semiconductor layer 14 through thermal diffusion. In some embodiments, the doped semiconductor structure 104' may be formed through chemical reaction. In some embodiments, the doped semiconductor structure 104' may be formed by introducing an n-type dopant into the semiconductor layer 14 through chemical reaction. In some embodiments, the doped semiconductor structure 104' may be formed by introducing another dopant into the semiconductor layer 14 through chemical reaction.

Figure 3D:
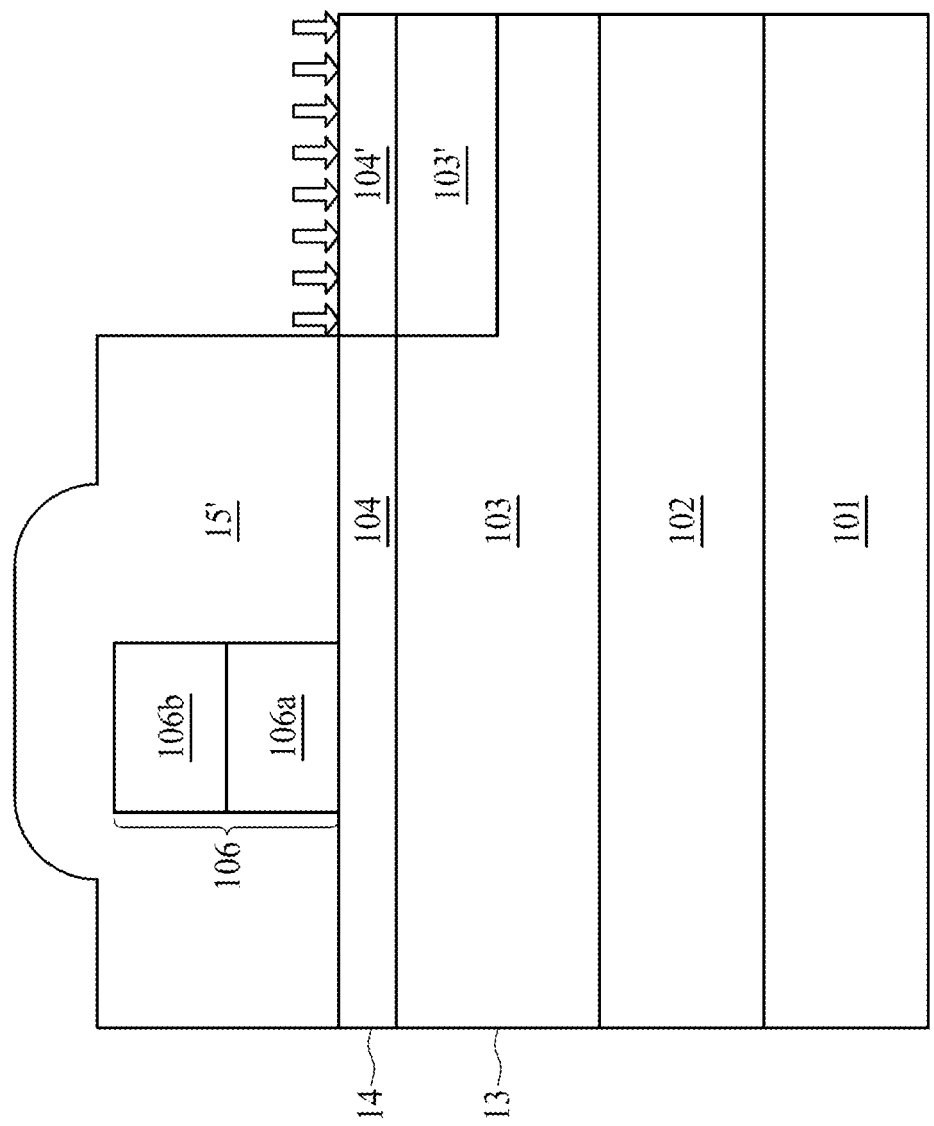

Referring to FIG. 3D, as indicated by the arrows, a doped semiconductor structure 103' may be formed by doping the semiconductor layer 13. In some embodiments, a semiconductor layer 103 may be formed in the semiconductor layer 13. In some embodiments, an undoped semiconductor layer 103 may be formed in the semiconductor layer 13. In some embodiments, an undoped semiconductor layer 103 and the doped semiconductor structure 103' may be formed in the semiconductor layer 13. In some embodiments, the doped semiconductor structure 103' may be formed through ion implantation. In some embodiments, the doped semiconductor structure 103' may be formed by implanting, for example, but not limited to, an n-type dopant into the semiconductor layer 13. In some embodiments, the doped semiconductor structure 103' may be formed by implanting, for example, but not limited to, another dopant into the semiconductor layer 13. In some embodiments, the doped semiconductor structure 103' may be formed through thermal diffusion. In some embodiments, the doped semiconductor structure 103' may be formed by introducing an n-type dopant into the semiconductor layer 13 through thermal diffusion. In some embodiments, the doped semiconductor structure 103' may be formed by introducing another dopant into the semiconductor layer 13 through thermal diffusion. In some embodiments, the doped semiconductor structure 103' may be formed through chemical reaction. In some embodiments, the doped semiconductor structure 103' may be formed by introducing an n-type dopant into the semiconductor layer 13 through chemical reaction. In some embodiments, the doped semiconductor structure 103' may be formed by introducing another dopant into the semiconductor layer 13 through chemical reaction.

In some embodiments, the doped semiconductor structure 104' and the doped semiconductor structure 103' may be formed simultaneously. In some embodiments, the doped semiconductor structure 104' and the doped semiconductor structure 103' may not be formed simultaneously. In some embodiments, the doped semiconductor structure 104' may be formed subsequent to the formation of the doped semiconductor structure 103'. In some embodiments, only the doped semiconductor structure 104' may be formed, and the doped semiconductor structure 103' is not formed.

In some embodiments, when the doped semiconductor structure 103' is formed through ion implantation, elements of the ion implantation may include Si and Ge. In some embodiments, when the doped semiconductor structure 104' is formed through ion implantation, elements of the ion implantation may include Si and Ge. In some embodiments, when the doped semiconductor structure 103' and the doped semiconductor structure 104' are formed through ion implantation, elements of the ion implantation may include Si and Ge. A temperature of ion implantation may range from room temperature to 700° C.

In some embodiments, when the doped semiconductor structure 103' is formed through thermal diffusion, a temperature of the thermal diffusion may range from 100° C. to 1500° C., and pressure of the thermal diffusion may range from atmospheric pressure to 100 Mpa. In some embodiments, when the doped semiconductor structure 104' is formed through thermal diffusion, a temperature of the thermal diffusion may range from 100° C. to 1500° C., and pressure of the thermal diffusion may range from atmospheric pressure to 100 Mpa. In some embodiments, when the doped semiconductor structure 103' and the doped semiconductor structure 104' are formed through thermal diffusion, a temperature of the thermal diffusion may range from 100° C. to 1500° C., and pressure of the thermal diffusion may range from atmospheric pressure to 100 Mpa.

In some embodiments, when the doped semiconductor structure 103' is formed through chemical reaction, a metal may be used to react with the semiconductor layer 13 to form n-type doping. In some embodiments, when the doped semiconductor structure 104' is formed through chemical reaction, a metal may be used to react with the semiconductor layer 14 to form n-type doping. In some embodiments, when the doped semiconductor structure 103' and the doped semiconductor structure 104' are formed through chemical reaction, a metal may be used to respectively react with the semiconductor layer 13 and the semiconductor layer 14 to form n-type doping.

In some embodiments, the semiconductor layer 13 may be GaN, and the semiconductor layer 14 may be AlGaN. Ti may be used to react with AlGaN and GaN to generate aluminum tantalum nitride ($AlTi_2N$) and TiN, and n vacancies are formed in AlGaN and GaN, to form n-type ALGaN and n-type GaN. In some embodiments, a temperature range of the chemical reaction may range approximately 400° C. to 1000° C.

In addition to the embodiments of FIG. 3C and FIG. 3D, in some embodiments, the doped semiconductor structure 104' may be formed through epitaxial growth. In some embodiments, the exposed portion of the semiconductor layer 104 covered by the passivation layer 15' may be etched, and then, epitaxial growth of n-type AlGaN is performed to form the doped semiconductor structure 104'. In some embodiments, the doped semiconductor structure 104' and the doped semiconductor structure 103' may be formed through epitaxial growth. In some embodiments, the exposed portion of the semiconductor layer 104 covered by the passivation layer 15' and the semiconductor layer 103 below the exposed portion may be etched, and then, epitaxial growth of n-type AlGaN and n-type GaN is performed to form the doped semiconductor structure 104' and the doped semiconductor structure 103'. In some embodiments, metal-organic chemical vapor deposition (MOCVD) may be used to perform the epitaxial growth. In some embodiments, a doped n-type impurity may be Si, Ge, or the like. In some embodiments, a growth temperature may approximately range from 700 to 1200° C.

In some embodiments, a doping concentration of the doped semiconductor structure 104' may be approximately $10^{16}$ $cm^{-3}$ to $10^{20}$ $cm^{-3}$. In some embodiments, a doping concentration of the doped semiconductor structure 103' may be approximately $10^{16}$ $cm^{-3}$ to $10^{20}$ $cm^{-3}$. In some embodiments, the doping concentration of the doped semiconductor structure 104' may be the same as the doping concentration of the doped semiconductor structure 103'. In some embodiments, the doping concentration of the doped semiconductor structure 104' may be different from the doping concentration of the doped semiconductor structure 103'.

In some embodiments, the thickness of the doped semiconductor structure 104' may be less than approximately 1 μm. In some embodiments, the thickness of the doped semiconductor structure 104' may be the same as the thickness of the semiconductor layer 14. In some embodiments, the thickness of the doped semiconductor structure 103' may be less than approximately 1 μm. In some embodiments, the overall thickness of the doped semiconductor structure 104' and the doped semiconductor structure 103' may be less than approximately 1 μm.

In some embodiments, the width of the doped semiconductor structure 104' may be between approximately 10 nm and approximately 10 μm. In some embodiments, the width of the doped semiconductor structure 104' may be between approximately 1 μm and approximately 5 μm. In some embodiments, the width of the doped semiconductor structure 103' may be between approximately 10 nm and approximately 10 μm. In some embodiments, the width of the doped semiconductor structure 103' may be between approximately 1 μm and approximately 5 μm. In some embodiments, the width of the doped semiconductor structure 104' may be the same as the width of the doped semiconductor structure 103'. In some embodiments, the width of the doped semiconductor structure 104' may be different from the width of the doped semiconductor structure 103'.

Figure 3E:
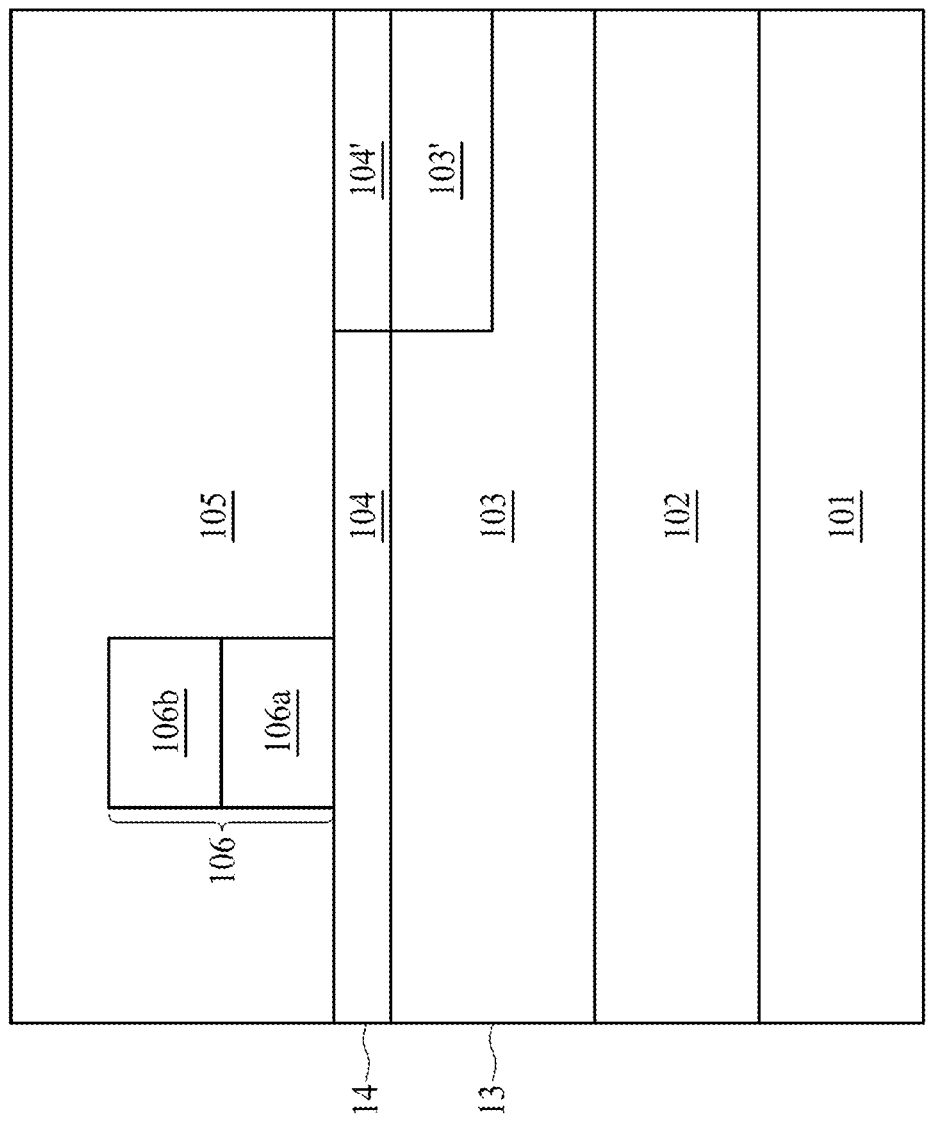

Referring to FIG. 3E, a passivation layer 105 may be formed though a deposition step. In some embodiments, the passivation layer 105 may be deposited through CVD and/or another suitable deposition step. In some embodiments, the passivation layer 105 may include the passivation layer 15' shown in FIG. 3D. In some embodiments, the passivation layer 105 may not include the passivation layer 15' shown in FIG. 3D. In some embodiments, the passivation layer 105 may cover the semiconductor layer 14. In some embodiments, the passivation layer 105 may cover the semiconductor layer 104. In some embodiments, the passivation layer 105 may cover the doped semiconductor structure 104'.

Figure 3F:
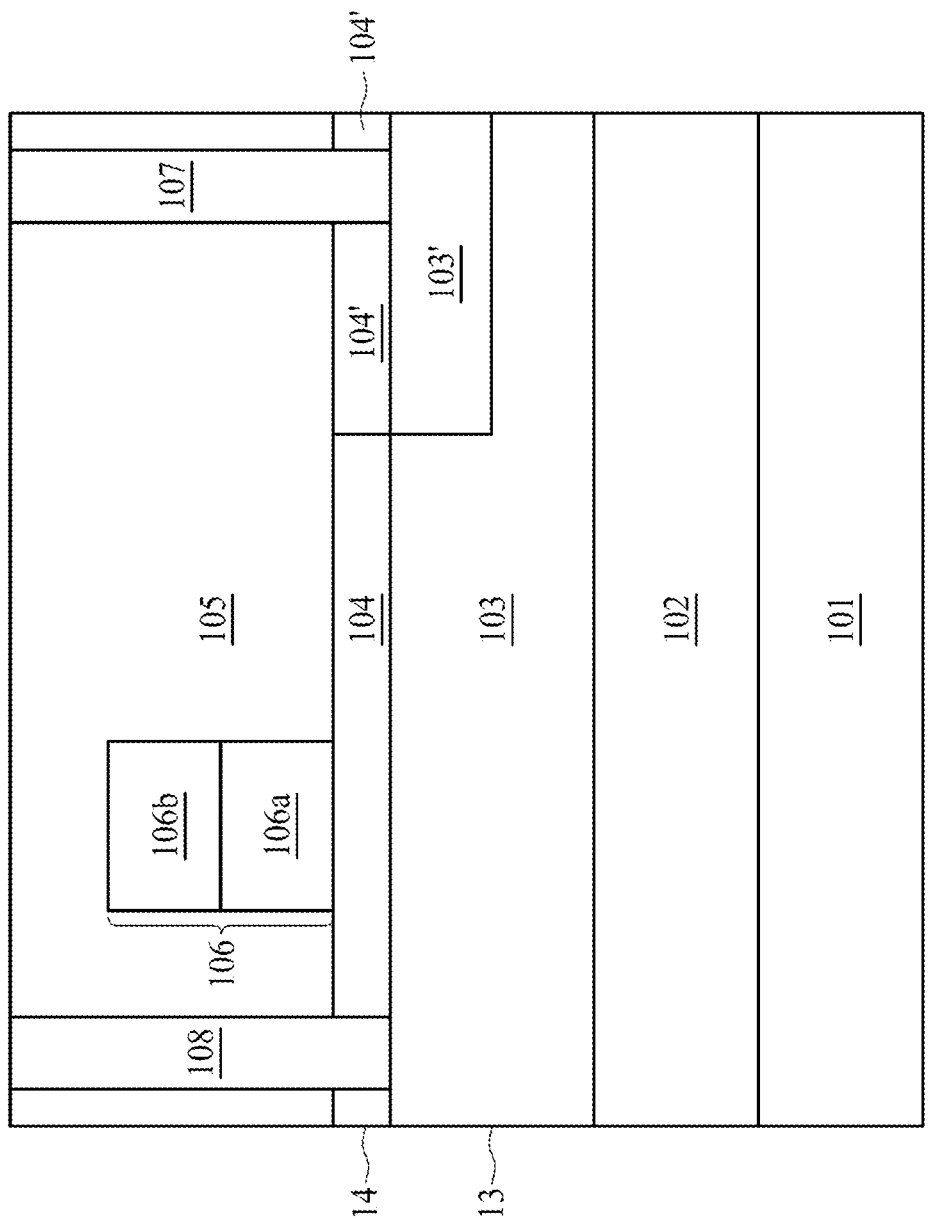
Figure 3G:
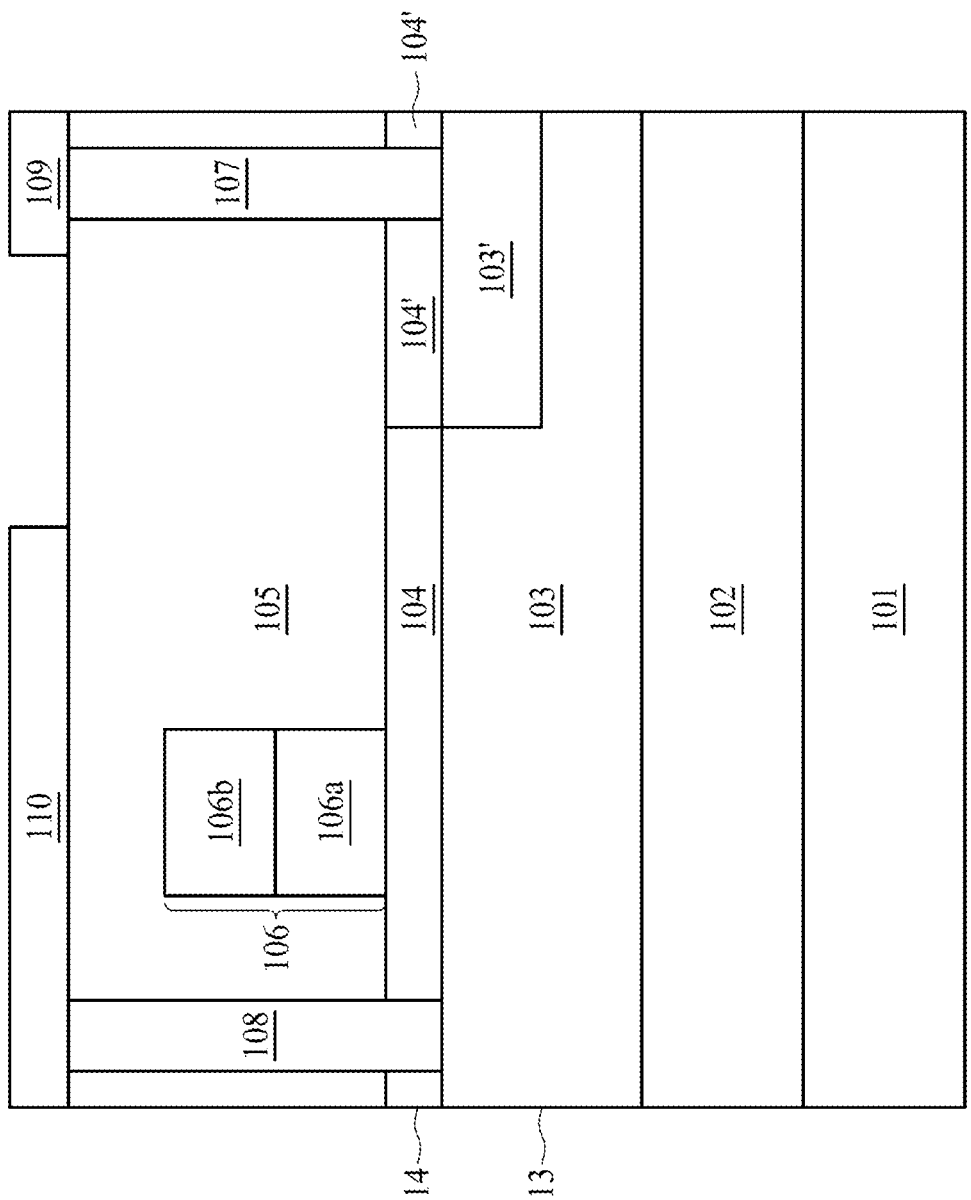

Referring to FIG. 3F, a conductive structure 108 passing through the passivation layer 105 may be formed on the semiconductor layer 13. In some embodiments, the conductive structure 108 may pass through the semiconductor layer 14 to come into contact with the semiconductor layer 13. In some embodiments, the conductive structure 108 may pass through the semiconductor layer 104 to come into contact with the semiconductor layer 103. In some embodiments, the conductive structure 108 may extend into the semiconductor layer 13. In some embodiments, the conductive structure 108 may extend into the semiconductor layer 103. In some embodiments, the conductive structure 108 may be formed through CVD, PVD, ALD, electroplating, and/or another suitable step. In some embodiments, the conductive structure 108 may be formed on the semiconductor layer 13 through PVD and/or another suitable deposition step. In some embodiments, the conductive structure 108 may be formed on the semiconductor layer 103 through PVD and/or another suitable deposition step.

Referring to FIG. 3F again, a conductive structure 107 passing through the passivation layer 105 may be formed on the doped semiconductor structure 103'. In some embodiments, the conductive structure 107 may pass through the doped semiconductor structure 104' to come into contact with the doped semiconductor structure 103'. In some embodiments, the conductive structure 107 may extend into the doped semiconductor structure 103'. In some embodiments, the conductive structure 107 may be formed through CVD, PVD, ALD, electroplating, and/or another suitable step. In some embodiments, the conductive structure 107 may be formed on the semiconductor layer 103 through PVD and/or another suitable deposition step. In some embodiments, the doped semiconductor structure 104' is disposed below the conductive structure 107 and extend toward a portion below the conductive structure 106. In some embodiments, the doped semiconductor structure 103' is disposed below the conductive structure 107 and extend toward a portion below the conductive structure 106.

Referring to 3G, a conductive structure 110 may be formed on a passivation layer 105. In some embodiments, the conductive structure 110 may be formed through CVD, PVD, ALD, electroplating, and/or another suitable step. In some embodiments, the conductive structure 110 may be formed on the passivation layer 105 through PVD and/or another suitable deposition step. In some embodiments, the conductive structure 110 may be electrically coupled to the conductive structure 108.

Referring to 3G again, a conductive structure 109 may be formed on the passivation layer 105. In some embodiments, the conductive structure 109 may be formed through CVD, PVD, ALD, electroplating, and/or another suitable step. In some embodiments, the conductive structure 109 may be formed on the passivation layer 105 through PVD and/or another suitable deposition step. In some embodiments, the conductive structure 109 may be electrically coupled to the conductive structure 107.

Figure 4A:
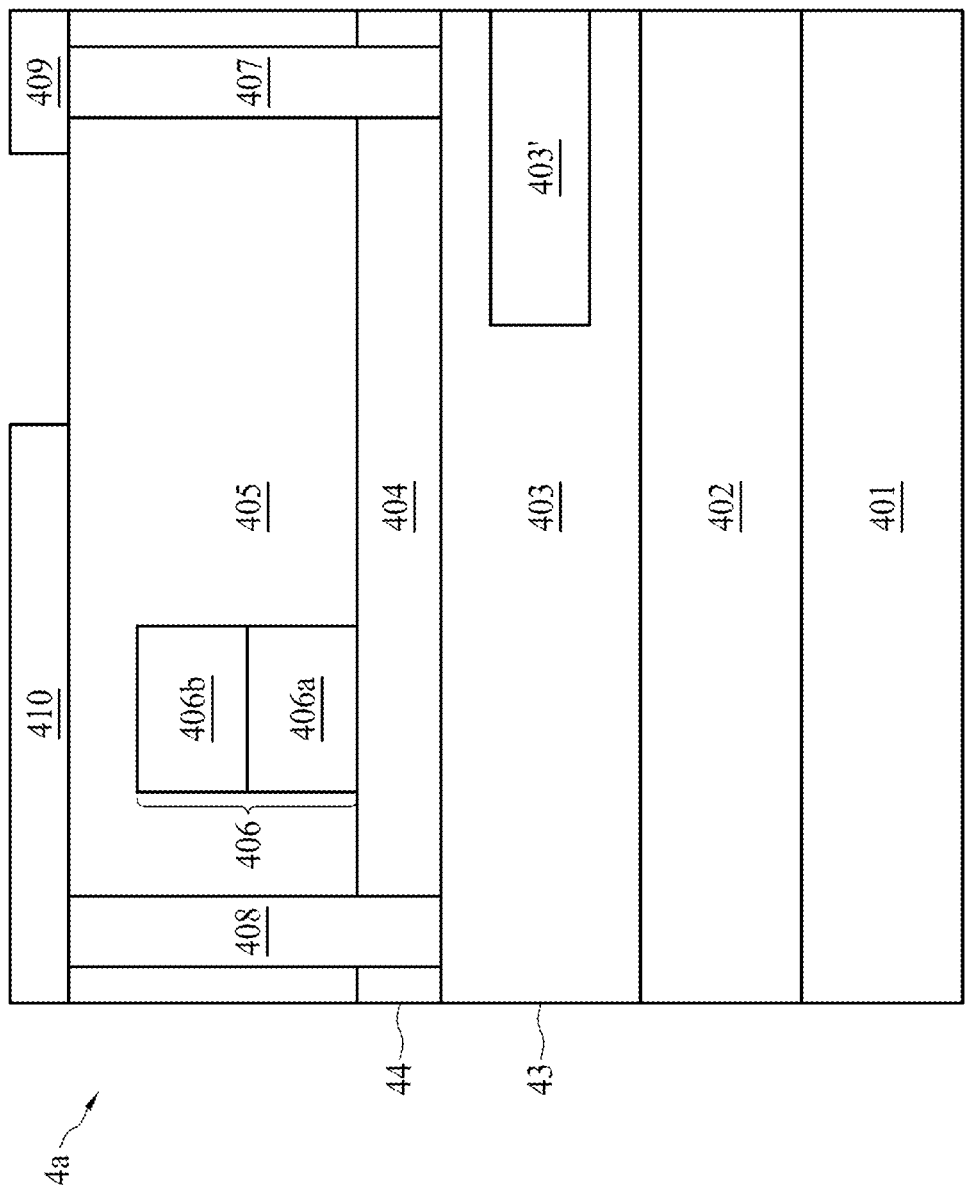
FIG. 4A is a side view of a semiconductor device according to some embodiments of this application.

FIG. 4A shows a structure 4a of a semiconductor device according to some embodiments of the present disclosure.

As shown in FIG. 4A, the structure 4a may include a substrate 401, a buffer layer 402, a semiconductor layer 43, a semiconductor layer 44, a passivation layer 405, a conductive structure 406, a conductive structure 407, a conductive structure 408, a conductive structure 409, and a conductive structure 410. As shown in FIG. 4A, the substrate 401, the buffer layer 402, the semiconductor layer 43, the semiconductor layer 44, the passivation layer 405 (or the conductive structure 406, the conductive structure 407, and the conductive structure 408), the conductive structure 409 (or the conductive structure 410) are stacked in sequence in a thickness direction of the structure 4a.

The substrate 401 may include, for example, but is not limited to, Si, doped Si, SiC, SiGe, GaAs, or another semiconductor material. The substrate 401 may include, for example, but is not limited to, sapphire, SOI, or another suitable material.

The buffer layer 402 may be disposed on the substrate 401. In some embodiments, the buffer layer 402 may include nitrides. In some embodiments, the buffer layer 402 may include, for example, but is not limited to, AlN. In some embodiments, the buffer layer 402 may include, for example, but is not limited to, GaN. In some embodiments, the buffer layer 402 may include, for example, but is not limited to, AlGaN. In some embodiments, the buffer layer 402 may include, for example, but is not limited to, GaAs. In some embodiments, the buffer layer 402 may include, for example, but is not limited to, AlAs. In some embodiments, the buffer layer 402 may include, for example, but is not limited to, ZnO.

The buffer layer 402 may be disposed between the substrate 401 and the semiconductor layer 43. Disposing the buffer layer 402 between the substrate 401 and the semiconductor layer 43 may reduce lattice mismatches and thermal mismatches between the substrate 401 and the semiconductor layer 43.

The semiconductor layer 43 may be disposed on the buffer layer 402. The semiconductor layer 43 may further include a semiconductor layer 403 and a doped semiconductor structure 403'.

The semiconductor layer 403 may be disposed on the buffer layer 402. The semiconductor layer 403 may include a III-V group material. The semiconductor layer 403 may include, for example, but is not limited to, III group nitrides. The semiconductor layer 403 may include, for example, but is not limited to, GaN.

The doped semiconductor structure 403' may be disposed on the buffer layer 402. The doped semiconductor structure 403' may include a doped III-V group material. The doped semiconductor structure 403' may include an n-type III-V group material. The doped semiconductor structure 403' may include, for example, but is not limited to, n-type III group nitrides. The doped semiconductor structure 403' may include, for example, but is not limited to, n-type GaN. The doped semiconductor structure 403' may include, for example, but is not limited to, n-type AlN. The doped semiconductor structure 403' may include, for example, but is not limited to, n-type InN. The doped semiconductor structure 403' may include, for example, but is not limited to, an n-type compound $In_xAl_yGa_{1-x-y}N$, where x+y≤1. The doped semiconductor structure 403' may include, for example, but is not limited to, an n-type compound $Al_yGa_{(1-y)}N$, where y≤1. The doped semiconductor structure 403' may include, for example, but is not limited to, n-type AlInGaN. The doped semiconductor structure 403' may include, for example, but is not limited to, n-type InAlN. The doped semiconductor structure 403' may include, for example, but is not limited to, n-type InN. A dopant material of the doped semiconductor structure 403' may include, for example, but is not limited to, at least one of Si and germanium (Ge). The thickness of the doped semiconductor structure 403' may range from approximately 2 nm to approximately 1000 nm. The thickness of the doped semiconductor structure 403' may preferably range from approximately 50 nm to approximately 800 nm.

A doping concentration of the doped semiconductor structure 403' may range from approximately $10^{15}$ cm$^{-3}$ to approximately $10^{21}$ cm$^{-3}$. The doping concentration of the doped semiconductor structure 403' may preferably range from approximately $10^{16}$ cm$^{-3}$ to approximately $10^{20}$ cm$^{-3}$. The doping concentration of the doped semiconductor structure 403' may optimally range from approximately $10^{18}$ cm$^{-3}$ to approximately $10^{20}$ cm$^{-}$. In some embodiments, the doping concentration of the doped semiconductor structure 403' may be distributed in a Gaussian distribution. In some embodiments, the width of the doped semiconductor structure 403' may be defined by the doping concentration of the dopant material. In some embodiments, for example, the width of the doped semiconductor structure 403' may be defined by observable edges of dopant materials on two ends in the side view of FIG. 4A.

In some embodiments, the doped semiconductor structure 403' may be disposed below the conductive structure 407. In some embodiments, the doped semiconductor structure 403' is not in contact with the conductive structure 407. In some embodiments, the doped semiconductor structure 403' is not in contact with the buffer layer 402. In some embodiments, the doped semiconductor structure 403' is not in contact with the semiconductor layer 404.

The semiconductor layer 44 may be disposed on the semiconductor layer 43. The semiconductor layer 44 may further include a semiconductor layer 404.

The semiconductor layer 404 may be disposed on the semiconductor layer 403. The semiconductor layer 404 may include a III-V group material. The semiconductor layer 404 may include, for example, but is not limited to, III group nitrides. The semiconductor layer 404 may include, for example, but is not limited to, a compound $Al_yGa_{(1-y)}N$, where y≤1.

In some embodiments, the doped semiconductor structure 403' may be disposed below the conductive structure 407 and extend toward a portion below the conductive structure 406. In some embodiments, the doped semiconductor structure 403' may include a doped semiconductor material. In some embodiments, the doped semiconductor structure 403' may include a doped semiconductor material with a high doping concentration. In some embodiments, the doped semiconductor structure 403' may include a doped semiconductor material with a high carrier concentration. In some embodiments, the doped semiconductor structure 403' may include a doped semiconductor material with a high electron concentration. In some embodiments, the doped semiconductor structure 403' may include a doped semiconductor material with a low doping concentration. In some embodiments, the doped semiconductor structure 403' may include a doped semiconductor material with a low carrier concentration. In some embodiments, the doped semiconductor structure 403' may include a doped semiconductor material with a low electron concentration. In some embodiments, the doped semiconductor structure 403' may be considered as a deceleration structure of a depletion region (not shown in FIG. 4A). In some embodiments, the doped semiconductor structure 403' may be considered as a deceleration structure of a depletion region below the conductive structure 406.

The structure 4a of the semiconductor device shown in FIG. 4A is similar to the structure 1a of the semiconductor device shown in FIG. 1A, and differences are as follows: In some embodiments, in the structure 4a, the semiconductor layer 44 does not include a doped semiconductor structure, and the thickness of the doped semiconductor structure 403' may be less than the thickness of the semiconductor layer 43. In some embodiments, the thickness of the doped semiconductor structure 403' may be less than a half of the thickness of the semiconductor layer 43. In some embodiments, the doped semiconductor structure 403' is not in contact with the semiconductor layer 404. In some embodiments, the doped semiconductor structure 403' is not in contact with the buffer layer 402. In some embodiments, a distance between the doped semiconductor structure 403' and the semiconductor layer 404 is greater than a distance between the doped semiconductor structure 403' and the buffer layer 402.

Figure 4B:
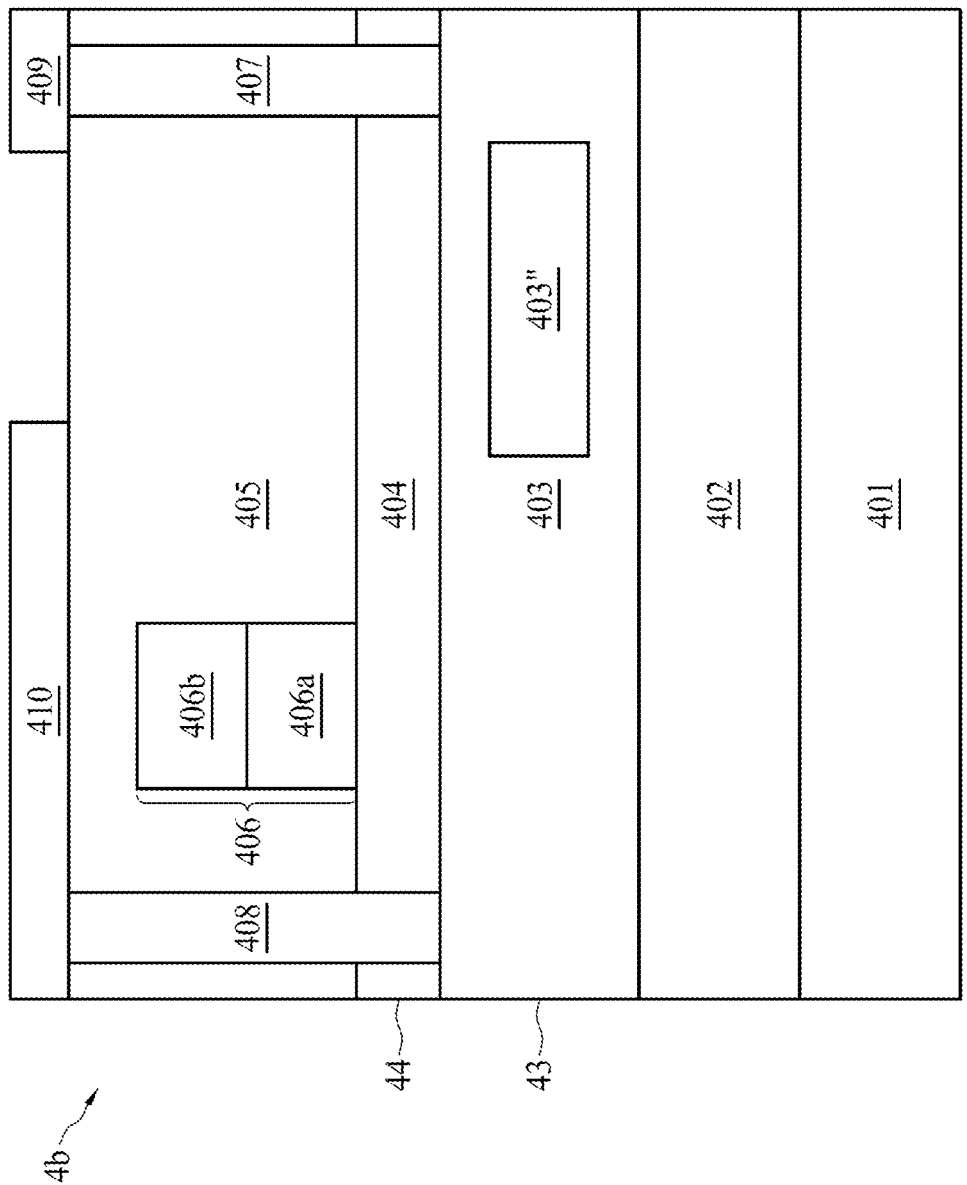
FIG. 4B is a side view of a semiconductor device according to some embodiments of this application.

FIG. 4B shows a structure 4b of a semiconductor device according to some embodiments of this application.

As shown in FIG. 4B, the structure 4b may include a substrate 401, a buffer layer 402, a semiconductor layer 43, a semiconductor layer 44, a passivation layer 405, a conductive structure 406, a conductive structure 407, a conductive structure 408, a conductive structure 409, and a conductive structure 410. The semiconductor layer 43 may further include a semiconductor layer 403 and a doped semiconductor structure 403". The semiconductor layer 44 may further include a semiconductor layer 404.

The structure 4b of the semiconductor device shown in FIG. 4B is similar to the structure 4a of the semiconductor device shown in FIG. 4A, and differs from the structure 4a in that a position of the doped semiconductor structure 403" shown in FIG. 4B is different from a position of the doped semiconductor structure 403' shown in FIG. 4A.

In some embodiments, the doped semiconductor structure 403" is disposed between a portion below the conductive structure 406 and a portion below the conductive structure 407. In some embodiments, the doped semiconductor structure 403" is disposed below the passivation layer 405 that is between the conductive structure 406 and the conductive structure 407. In some embodiments, the doped semiconductor structure 403" is not in contact with the conductive structure 407. In some embodiments, the doped semiconductor structure 403" is not in contact with the buffer layer 402. In some embodiments, the doped semiconductor structure 403" is not in contact with the semiconductor layer 404.

Referring to FIG. 4A and FIG. 4B again, the conductive structure 406 may serve as a gate conductor of the semiconductor device. In some embodiments, the conductive structure 406 may serve as a Schottky gate of the semiconductor device. The conductive structure 407 may serve as a drain conductor of the semiconductor device. The conductive structure 408 may serve as a source conductor of the semiconductor device. The conductive structure 407 that may serve as the drain conductor and the conductive structure 408 that may serve as the source conductor are respectively disposed on two sides of the conductive structure 406 that may serve as the gate conductor. However, the conductive structure 406, the conductive structure 407, and the conductive structure 408 may have different configurations in another embodiment of the present disclosure due to a design requirement. The conductive structure 406 may be configured to control 2DEG in the semiconductor layer 43. The conductive structure 406 may apply a voltage to control the 2DEG in the semiconductor layer 43. The conductive structure 406 may apply a voltage to control 2DEG below the semiconductor layer 44. The conductive structure 406 may apply a voltage to control switch-on between the conductive structure 408 and the conductive structure 407. The conductive structure 406 may apply a voltage to control switch-off between the conductive structure 408 and the conductive structure 407.

A relationship between an electric field of the semiconductor device shown in FIG. 4A and FIG. 4B and a distance between the gate conductor and the drain conductor may be similar to the curve 21 and the curve 22 shown in FIG. 2. For the semiconductor device with the doped semiconductor structure 403' or the doped semiconductor structure 403", reduction of a drain peak electric field may improve a breakdown voltage of the semiconductor device. In some embodiments, the semiconductor device with the doped semiconductor structure 403' or the doped semiconductor structure 403" may improve a drain electric field. In some embodiments, the semiconductor device with the doped semiconductor structure 403' or the doped semiconductor structure 403" may not need an epitaxial layer with especially thick epitaxy. In some embodiments, the semiconductor device with the doped semiconductor structure 403' or the doped semiconductor structure 403" may reduce process difficulty.

FIG. 5A, FIG. 5B, FIG. 5C, FIG. 5D, FIG. 5E, and FIG. 5F show several operations for manufacturing a semiconductor device according to some embodiments of this application.

Figure 5A:
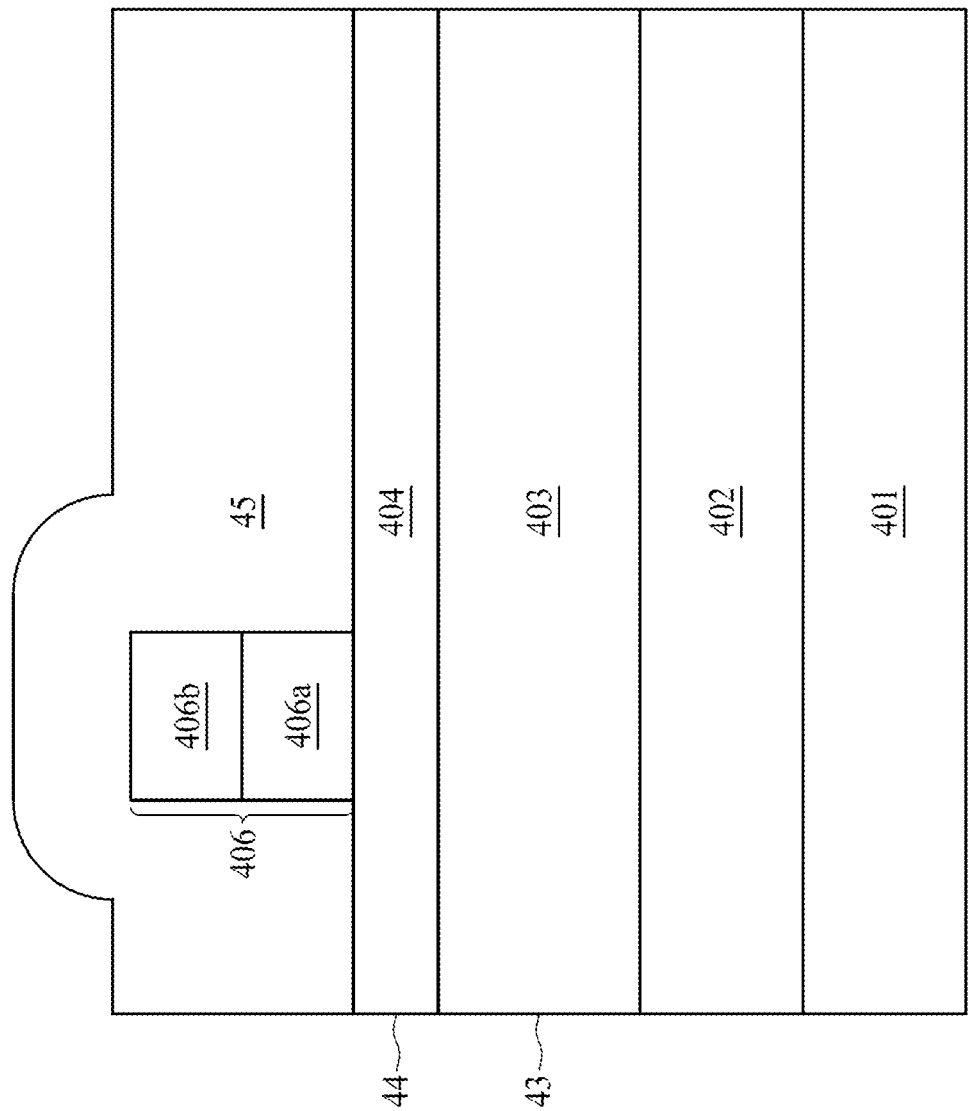
FIG. 5A, FIG. 5B, FIG. 5C, FIG. 5D, FIG. 5E, and FIG. 5F show several operations for manufacturing a semiconductor device according to some embodiments of this application.

Referring to FIG. 5A, a substrate 401 is provided. In some embodiments, a buffer layer 402 may be disposed on the substrate 401. In some embodiments, the buffer layer 402 may be formed through CVD and/or another suitable deposition step. In some embodiments, the buffer layer 402 may be formed on the substrate 401 through CVD and/or another suitable deposition step.

In some embodiments, a semiconductor layer 43 may be disposed on the buffer layer 402. In some embodiments, the semiconductor layer 43 may be formed through CVD and/or another suitable deposition step. In some embodiments, the semiconductor layer 43 may be formed on the buffer layer 402 through CVD and/or another suitable deposition step.

In some embodiments, a semiconductor layer 44 may be disposed on the semiconductor layer 43. In some embodiments, the semiconductor layer 44 may be formed through CVD and/or another suitable deposition step. In some embodiments, the semiconductor layer 44 may be formed on the semiconductor layer 43 through CVD and/or another suitable deposition step. It should be noted that, the semiconductor layer 44 may be formed subsequent to the formation of the semiconductor layer 43. It should be noted that, a heterojunction interface may be formed on the semiconductor layer 43 on which the semiconductor layer 44 is formed. It should be noted that, a forbidden band width of the formed semiconductor layer 44 may be greater than a forbidden band width of the formed semiconductor layer 43.

In some embodiments, a conductive structure 406 may be disposed on the semiconductor layer 44. The conductive structure 406 may include a doped semiconductor layer 406a and a contact 406b.

In some embodiments, the doped semiconductor layer 406a may be formed through ion implantation. In some embodiments, the doped semiconductor layer 406a may be formed by implanting, for example, but not limited to, a p-type dopant. The contact 406b may be formed on the doped semiconductor layer 406a. In some embodiments, the contact 406b may be formed through CVD, PVD, ALD, electroplating, and/or another suitable step. The doped semiconductor layer 406a may include a doped metallic compound. The doped semiconductor layer 406a may include, for example, but is not limited to, p-type GaN.

In some embodiments, the contact 406b may be formed on the doped semiconductor layer 406a through PVD and/or another suitable deposition step. The contact 406b may be disposed on the semiconductor layer 404. The contact 406b may be disposed on the doped semiconductor layer 406a, to locate the doped semiconductor layer 406a between the semiconductor layer 44 and the contact 406b. The contact 406b may include metal. The contact 406b may include, but is not limited to, Au, Pt, Ti, Pd, Ni, and W. The contact 406b may include a metallic compound. The contact 406b may include, for example, but is not limited to, TiN.

A passivation layer 45 may be formed though a deposition step. In some embodiments, the passivation layer 45 may be deposited on the semiconductor layer 44. In some embodiments, the passivation layer 45 may be deposited on the semiconductor layer 44 through CVD and/or another suitable deposition step. In some embodiments, the passivation layer 45 may cover the semiconductor layer 44. In some embodiments, the passivation layer 45 may cover the conductive structure 406. In some embodiments, the passivation layer 45 may surround the conductive structure 406. In some embodiments, the passivation layer 45 may surround the conductive structure 406.

Figure 5B:
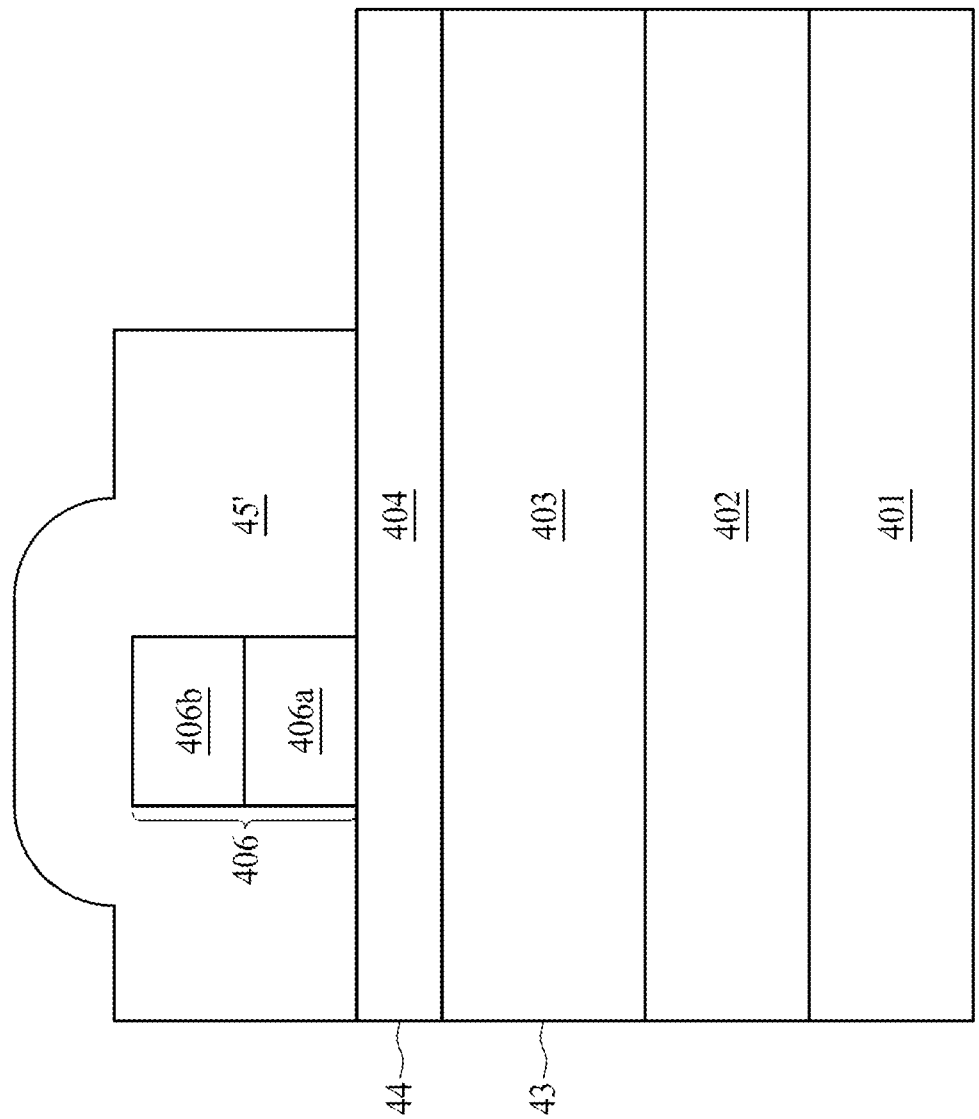

Referring to FIG. 5B, a portion of the passivation layer 45 is removed to form a passivation layer 45'. In some embodiments, the portion of the passivation layer 45 may be removed, for example, using a photolithography process, to form the passivation layer 45'. In some embodiments, the portion of the passivation layer 45 may be removed through etching to form the passivation layer 45'.

In some embodiments, the passivation layer 45' may expose a portion of the semiconductor layer 44. In some embodiments, the exposed part of the semiconductor layer 44 is not covered by the passivation layer 45'.

Figure 5C:
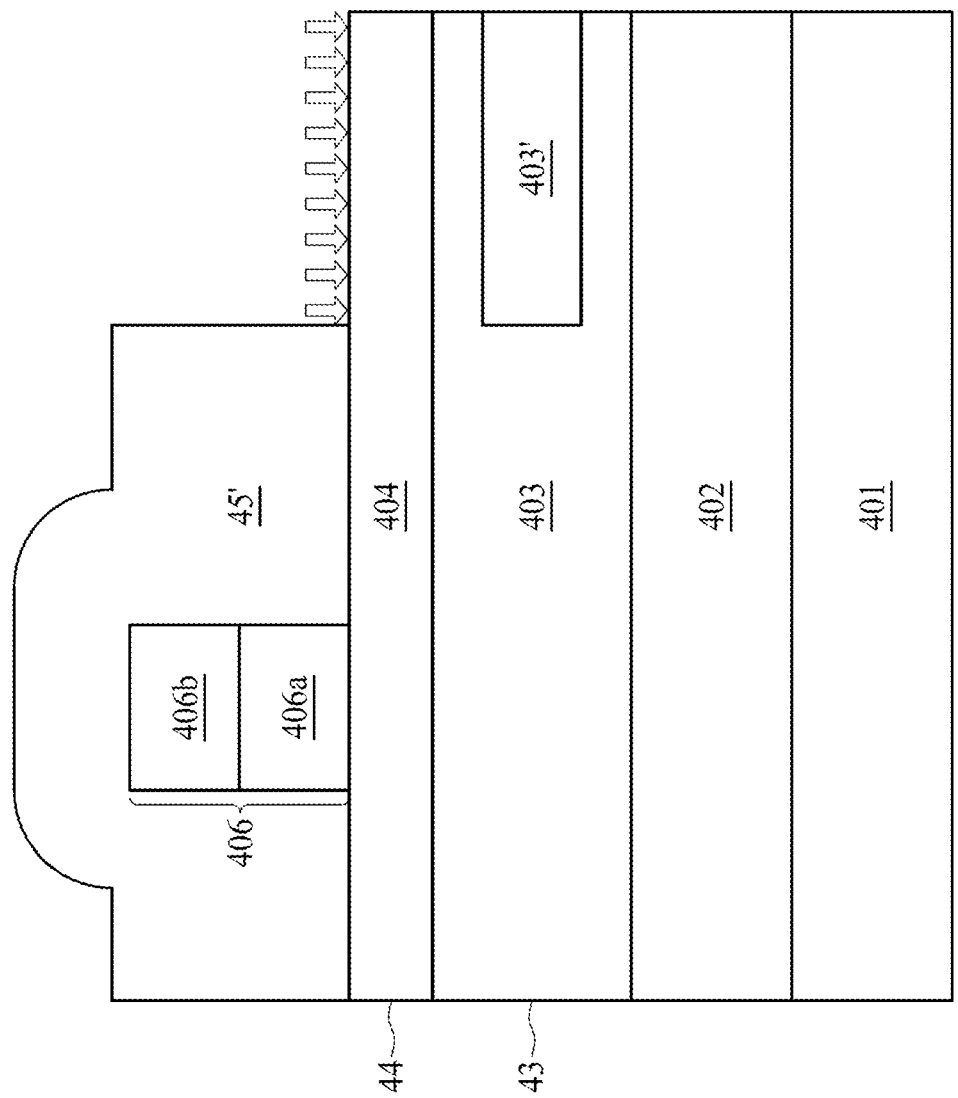

Referring to FIG. 5C, as indicated by the arrows, an undoped semiconductor layer 403 and a doped semiconductor structure 403' may be formed in the semiconductor layer 43. In some embodiments, the doped semiconductor structure 403' may be formed through ion implantation. In some embodiments, the doped semiconductor structure 403' may be formed by implanting, for example, but not limited to, an n-type dopant into the semiconductor layer 43. In some embodiments, the doped semiconductor structure 403' may be formed by implanting, for example, but not limited to, another dopant into the semiconductor layer 43.

In some embodiments, when the doped semiconductor structure 403' is formed through ion implantation, elements of the ion implantation may include Si and Ge. In some embodiments, when the doped semiconductor structure 403' is formed through ion implantation, elements of the ion implantation may include Si and Ge. A temperature of ion implantation may range from room temperature to 700° C.

A doping concentration of the doped semiconductor structure 403' may range from approximately $10^{15}$ cm$^{-3}$ to approximately $10^{21}$ cm$^{-3}$. The doping concentration of the doped semiconductor structure 403' may preferably range from approximately $10^{16}$ cm$^{-3}$ to approximately $10^{20}$ cm$^{-3}$. The doping concentration of the doped semiconductor structure 403' may optimally range from approximately $10^{18}$ cm$^{-3}$ to approximately $10^{20}$ cm$^{-3}$. In some embodiments, the doping concentration of the doped semiconductor structure 403' may be distributed in a Gaussian distribution.

The depth of the ion implantation may be selected to form the doped semiconductor structure 403' at different positions in the semiconductor layer 43. In some embodiments, the depth of the ion implantation may be selected, so that the doped semiconductor structure 403' is formed at a relatively deep position and is not in contact with the semiconductor layer 44. The depth of the ion implantation refers to a depth of a target position of an implanted dopant relative to a surface of the semiconductor layer 44. In some embodiments, the depth of the ion implantation may be controlled by changing an accelerating voltage of the ion implantation. For example, a relatively high accelerating voltage may implant the dopant at a relatively deep position.

Figure 5D:
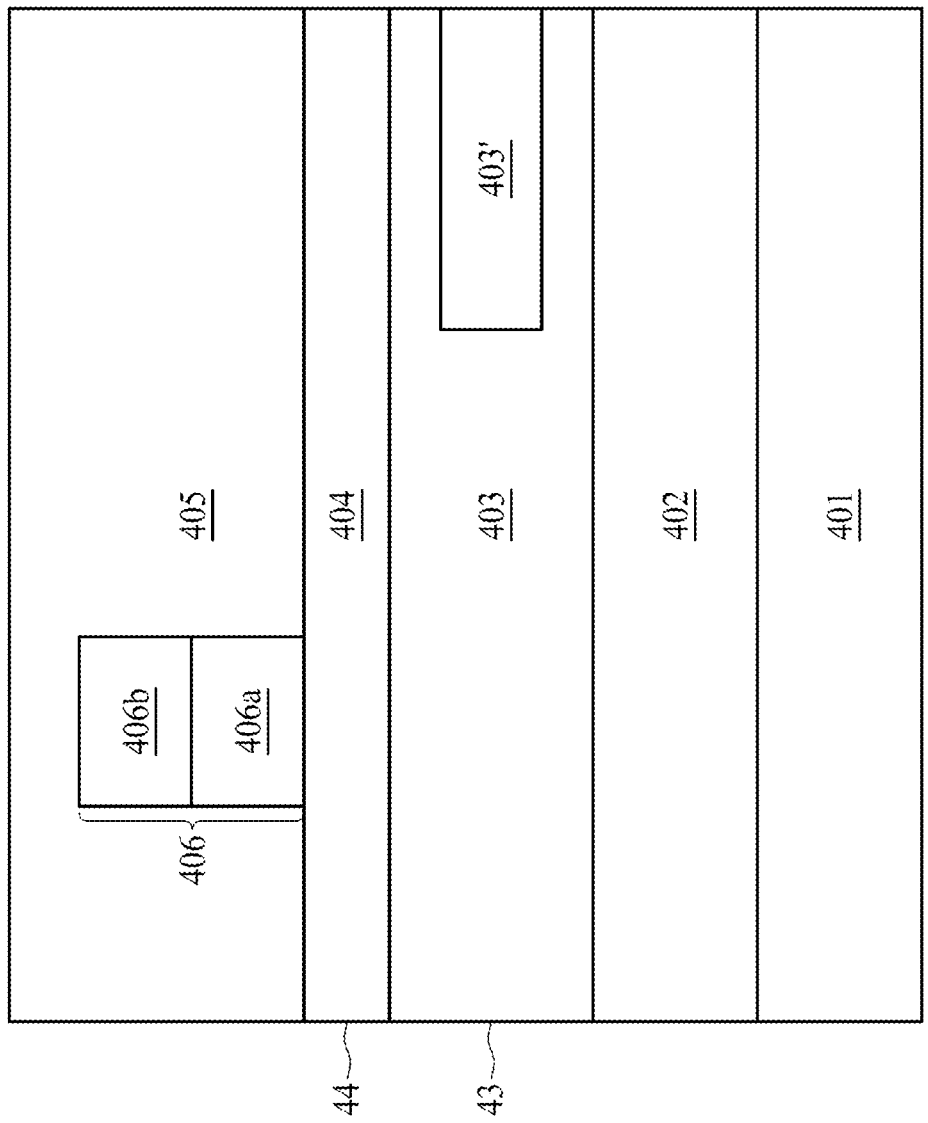

Referring to FIG. 5D, a passivation layer 405 may be formed though a deposition step. In some embodiments, the passivation layer 405 may be deposited through CVD and/or another suitable deposition step. In some embodiments, the passivation layer 405 may include the passivation layer 45' shown in FIG. 5C. In some embodiments, the passivation layer 405 may not include the passivation layer 45' shown in FIG. 5C. In some embodiments, the passivation layer 405 may cover a semiconductor layer 44. In some embodiments, the passivation layer 405 may cover a semiconductor layer 404.

Figure 5E:
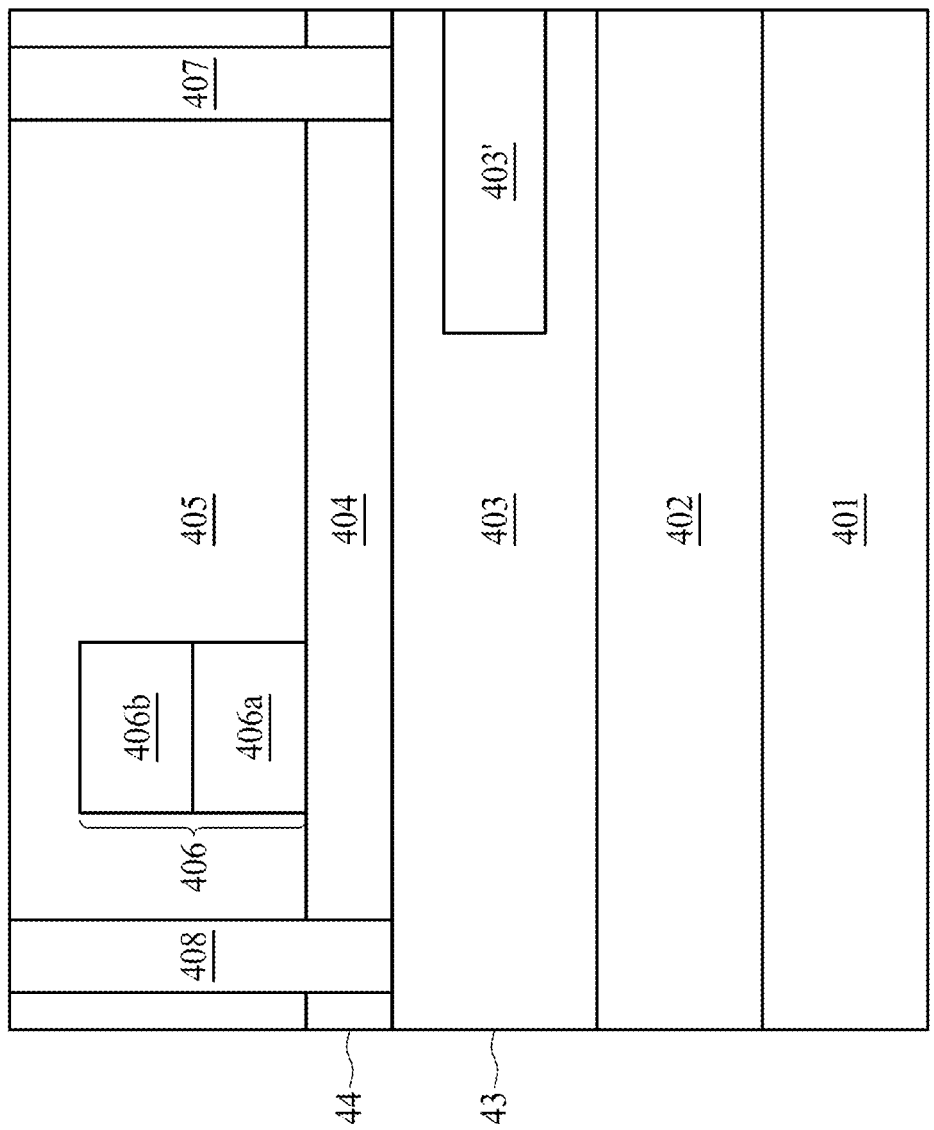
Figure 5F:
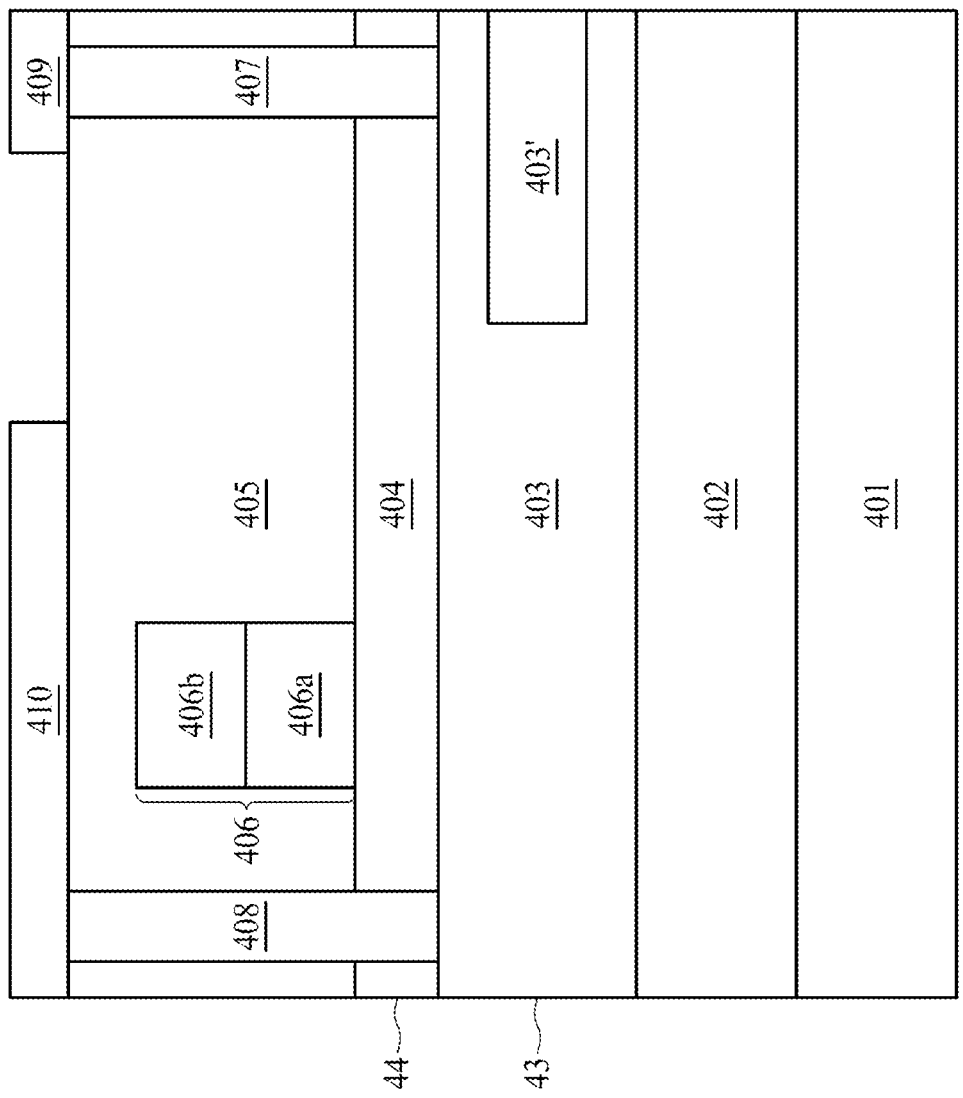

Referring to FIG. 5E, a conductive structure 408 passing through the passivation layer 405 may be formed on a semiconductor layer 43. In some embodiments, the conductive structure 408 may pass through the semiconductor layer 44 to come into contact with the semiconductor layer 43. In some embodiments, the conductive structure 408 may pass through the semiconductor layer 404 to come into contact with the semiconductor layer 403. In some embodiments, the conductive structure 408 may extend into the semiconductor layer 43. In some embodiments, the conductive structure 408 may extend into the semiconductor layer 403. In some embodiments, the conductive structure 408 may be formed through CVD, PVD, ALD, electroplating, and/or another suitable step. In some embodiments, the conductive structure 408 may be formed on the semiconductor layer 43 through PVD and/or another suitable deposition step. In some embodiments, the conductive structure 408 may be formed on the semiconductor layer 403 through PVD and/or another suitable deposition step.

Referring to FIG. 5E again, a conductive structure 407 passing through the passivation layer 405 may be formed on the doped semiconductor structure 43. In some embodiments, the conductive structure 407 may pass through the semiconductor layer 44 to come into contact with the semiconductor layer 43. In some embodiments, the conductive structure 407 may pass through the semiconductor layer 404 to come into contact with the semiconductor layer 403. In some embodiments, the conductive structure 407 may extend into the semiconductor layer 43. In some embodiments, the conductive structure 407 may extend into the semiconductor layer 403. In some embodiments, the conductive structure 407 may be formed through CVD, PVD, ALD, electroplating, and/or another suitable step. In some embodiments, the conductive structure 407 may be formed on the semiconductor layer 43 through PVD and/or another suitable deposition step. In some embodiments, the conductive structure 407 may be formed on the semiconductor layer 403 through PVD and/or another suitable deposition step.

Referring to 5F, a conductive structure 410 may be formed on the passivation layer 405. In some embodiments, the conductive structure 410 may be formed through CVD, PVD, ALD, electroplating, and/or another suitable step. In some embodiments, the conductive structure 410 may be formed on the passivation layer 405 through PVD and/or another suitable deposition step. In some embodiments, the conductive structure 410 may be electrically coupled to the conductive structure 408.

Referring to 5F again, a conductive structure 409 may be formed on the passivation layer 405. In some embodiments, the conductive structure 409 may be formed through CVD, PVD, ALD, electroplating, and/or another suitable step. In some embodiments, the conductive structure 409 may be formed on the passivation layer 405 through PVD and/or another suitable deposition step. In some embodiments, the conductive structure 409 may be electrically coupled to the conductive structure 407.

As used herein, space-related terms, such as "under", "below", "lower portion", "above", "upper portion", "lower portion", "left side", and "right side", may be used herein to simply describe a relationship between one component or feature and another component or feature as shown in the figures. In addition to orientation shown in the figures, space-related terms are intended to encompass different orientations of the apparatus in use or operation. A device may be oriented in other ways (rotated 90 degrees or at other orientations), and the space-related descriptors used herein may also be used for explanation accordingly. It should be understood that when a component is "connected" or "coupled" to another component, the component may be directly connected to or coupled to another component, or an intermediate component may exist.

As used herein, terms "approximately", "substantially", "essentially", and "about" are used for describing and explaining a small variation. When being used in combination with an event or circumstance, the term may refer to an example in which the event or circumstance occurs precisely, and an example in which the event or circumstance occurs approximately. As used herein with respect to a given value or range, the term "about" generally means in the range of ±10%, ±5%, ±1%, or ±0.5% of the given value or range. The range may be indicated herein as from one endpoint to another endpoint or between two endpoints. Unless otherwise specified, all ranges disclosed herein include endpoints. The term "substantially coplanar" may refer to two surfaces within a few micrometers (μm) positioned along the same plane, for example, within 10 μm, within 5 µm, within 1 µm, or within 0.5 µm disposed along the same plane. When reference is made to "substantially" the same numerical value or characteristic, the term may refer to a value within ±10%, ±5%, ±1%, or ±0.5% of the average of the values.

Several embodiments of this disclosure and features of details are briefly described above. The embodiments described in this disclosure may be easily used as a basis for designing or modifying other processes and structures for realizing the same or similar objectives and/or obtaining the same or similar advantages introduced in the embodiments of this application. Such equivalent construction does not depart from the spirit and scope of this disclosure, and various variations, replacements, and modifications can be made without departing from the spirit and scope of this disclosure.

What is claimed is:

1. A HEMT device, comprising:
   a channel layer;
   a barrier layer disposed on the channel layer; and
   a drain disposed on the barrier layer, wherein
   the channel layer comprises a doped semiconductor structure; wherein a width of the doped semiconductor structure is between approximately 10 nm and approximately 10 micrometers and a thickness of the doped semiconductor structure is between approximately 2 nm and approximately 1000 nm; wherein a doping concentration of the doped semiconductor structure ranges from approximately $10^{16}$ cm$^{-3}$ to approximately $10^{20}$ cm$^{-3}$; a gate conductor disposed on the barrier layer, wherein the doped semiconductor structure is disposed below the drain and extends toward a portion below the gate conductor; a source disposed on the channel layer and is surrounded by the barrier layer.

2. The HEMT device according to claim 1, wherein the doped semiconductor structure comprises at least one of n-type GaN, n-type AlGaN, n-type AlN, n-type AlInGaN, n-type AlInN, and n-type InN.

3. The HEMT device according to claim 1, wherein the doped semiconductor structure is horizontally spaced from the gate conductor.

4. The HEMT device according to claim 1, wherein the doped semiconductor structure is wider than the drain such that the drain is located between left and right borders of the doped semiconductor structure.

5. The HEMT device according to claim 1, wherein an entirety of the doped semiconductor structure of the channel layer is embedded into a body of the channel layer and is in a position lower than the drain.

6. A HEMT device, comprising:
   a channel layer;
   a barrier layer, disposed on the channel layer;
   a gate conductor, disposed on the barrier layer, and
   a drain, disposed on the barrier layer, wherein
   the channel layer comprises a doped semiconductor structure that is disposed between a portion below the drain and a portion below the gate conductor; wherein a width of the doped semiconductor structure is between approximately 10 nm and approximately 10 micrometers, a thickness of the doped semiconductor structure is between approximately 2 nm and approximately 1000 nm, and a doping concentration of the doped semiconductor structure ranges from approximately $10^{16}$ cm$^{-3}$ to approximately $10^{20}$ cm$^{-3}$; a source disposed on the channel layer and is surrounded by the barrier layer.

7. The HEMT device according to claim 6, wherein the doped semiconductor structure comprises at least one of n-type GaN, n-type AlGaN, n-type AlN, n-type AlInGaN, n-type AlInN, and n-type InN.

* * * * *